United States Patent
Jan et al.

(10) Patent No.: US 10,192,969 B2
(45) Date of Patent: Jan. 29, 2019

(54) TRANSISTOR GATE METAL WITH LATERALLY GRADUATED WORK FUNCTION

(71) Applicant: Intel Corporation, Santa Clara, CA (US)

(72) Inventors: Chia-Hong Jan, Portland, OR (US); Walid Hafez, Portland, OR (US); Hsu-Yu Chang, Hillsboro, OR (US); Roman Olac-Vaw, Hillsboro, OR (US); Ting Chang, Portland, OR (US); Rahul Ramaswamy, Hillsboro, OR (US); Pei-Chi Liu, Portland, OR (US); Neville Dias, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/327,641

(22) PCT Filed: Aug. 19, 2014

(86) PCT No.: PCT/US2014/051619
§ 371 (c)(1),
(2) Date: Jan. 19, 2017

(87) PCT Pub. No.: WO2016/028267
PCT Pub. Date: Feb. 25, 2016

(65) Prior Publication Data
US 2017/0207312 A1     Jul. 20, 2017

(51) Int. Cl.
*H01L 29/423* (2006.01)
*H01L 29/78* (2006.01)
(Continued)

(52) U.S. Cl.
CPC .. *H01L 29/42376* (2013.01); *H01L 21/28088* (2013.01); *H01L 21/32134* (2013.01);
(Continued)

(58) Field of Classification Search
CPC . H01L 29/42376; H01L 27/088; H01L 23/66; H01L 21/82385
(Continued)

(56) References Cited

U.S. PATENT DOCUMENTS

| 5,750,430 A | 5/1998 | Son |
| 6,225,669 B1 | 5/2001 | Long et al. |

(Continued)

FOREIGN PATENT DOCUMENTS

| JP | H0279474 | 3/1990 |
| JP | 2001308323 | 11/2001 |

(Continued)

OTHER PUBLICATIONS

International Search Report and Written Opinion for PCT/US14/51619 dated May 8, 2015, 13 pages.
(Continued)

*Primary Examiner* — Mark Prenty
(74) *Attorney, Agent, or Firm* — Green, Howard & Mughal LLP

(57) ABSTRACT

Semiconductor device(s) including a transistor with a gate electrode having a work function monotonically graduating across the gate electrode length, and method(s) to fabricate such a device. In embodiments, a gate metal work function is graduated between source and drain edges of the gate electrode for improved high voltage performance. In embodiments, thickness of a gate metal graduates from a non-zero value at the source edge to a greater thickness at the drain edge. In further embodiments, a high voltage transistor with graduated gate metal thickness is integrated
(Continued)

with another transistor employing a gate electrode metal of nominal thickness. In embodiments, a method of fabricating a semiconductor device includes graduating a gate metal thickness between a source end and drain end by non-uniformly recessing the first gate metal within the first opening relative to the surrounding dielectric.

11 Claims, 14 Drawing Sheets

(51) Int. Cl.
    *H01L 21/28* (2006.01)
    *H01L 29/49* (2006.01)
    *H01L 29/66* (2006.01)
    *H01L 21/8234* (2006.01)
    *H01L 27/088* (2006.01)
    *H01L 21/3213* (2006.01)
    *H01L 23/535* (2006.01)
    *H01L 23/66* (2006.01)
    *H01L 21/3115* (2006.01)

(52) U.S. Cl.
    CPC .. *H01L 21/32136* (2013.01); *H01L 21/32139* (2013.01); *H01L 21/82345* (2013.01); *H01L 21/823456* (2013.01); *H01L 21/823475* (2013.01); *H01L 23/535* (2013.01); *H01L 23/66* (2013.01); *H01L 27/088* (2013.01); *H01L 29/4966* (2013.01); *H01L 29/4983* (2013.01); *H01L 29/66545* (2013.01); *H01L 29/78* (2013.01); *H01L 21/31155* (2013.01)

(58) Field of Classification Search
    USPC ........................................................ 257/407
    See application file for complete search history.

(56) References Cited

U.S. PATENT DOCUMENTS

| | | | |
|---|---|---|---|
| 6,707,112 B2* | 3/2004 | Kachelmeier | H01L 21/28167 257/368 |
| 6,861,712 B2 | 3/2005 | Gao et al. | |
| 6,878,579 B2 | 4/2005 | Ohuchi | |
| 7,666,727 B2 | 2/2010 | Doyle | |
| 8,629,022 B2* | 1/2014 | Chidambarrao | H01L 21/823857 257/406 |
| 8,938,203 B2 | 1/2015 | Ancora et al. | |
| 2005/0224886 A1 | 10/2005 | Doyle et al. | |
| 2006/0244079 A1 | 11/2006 | Wang | |
| 2007/0138574 A1* | 6/2007 | Eikyu | H01L 21/28114 257/384 |
| 2010/0127331 A1* | 5/2010 | Ratnakumar | G06F 17/5063 257/365 |
| 2010/0283107 A1 | 11/2010 | Muller et al. | |
| 2012/0104513 A1 | 5/2012 | Zhu et al. | |
| 2012/0175703 A1* | 7/2012 | Park | H01L 29/0847 257/336 |
| 2012/0256279 A1* | 10/2012 | Wu | H01L 29/66795 257/412 |
| 2014/0070320 A1 | 3/2014 | Mukherjee et al. | |

FOREIGN PATENT DOCUMENTS

| | | |
|---|---|---|
| JP | 2004221596 | 8/2004 |
| JP | 2009519589 | 5/2009 |
| JP | 2013518491 | 5/2013 |
| KR | 1020100015071 | 2/2010 |

OTHER PUBLICATIONS

Extended European Search Report for European Patent Application No. 14900215, dated Feb. 16, 2018.

Notification of Reasons for Refusal for Japanese Patent Application No. 2017-503095, dated May 18, 2018.

Mustafa, M et al., "Threshold Voltage Sensitivity to Metal Gate Work-Function Based Performance Evaluation of Double-Gate n-FinFET Structures for LSTP Technology", World Journal of Nano Science and Engineering, 2013, 3, 17-22 http://dx.doi.org/10.4236/wjnse.2013.31003 Published Online Mar. 2013 (http://www.scirp.org/journal/wjnse).

Notice of Allowance dated Aug. 18, 2018 for Japanese Patent Application No. 2017-503095.

Office Action & Search Report dated Aug. 28, 2018 for Taiwan Patent Application No. 104122557.

\* cited by examiner

TRANSISTOR GATE METAL WITH LATERALLY GRADUATED WORK FUNCTION

CLAIM OF PRIORITY

This application is a National Phase Application of, and claims priority to, PCT Application No. PCT/US14/51619, filed on 19 Aug. 2014, titled "TRANSISTOR GATE METAL WITH LATERALLY GRADUATED WORK FUNCTION", which is incorporated by reference in its entirety for all purposes.

TECHNICAL FIELD

Embodiments described herein generally relate to integrated circuits (ICs) and monolithic semiconductor devices, and more particularly pertain to transistors employing metal gate electrodes with a lateral graduated work function.

BACKGROUND

Monolithic ICs generally comprise a number of transistors, such as metal-oxide-semiconductor field-effect transistors (MOSFETs), or more generally metal-insulating-semiconductor field-effect transistors (MISFETs), fabricated over a planar substrate, such as a silicon wafer. Current system on a chip (SoC) technologies are aggressively scaling the FET gate length ($L_g$) to provide performance and area scaling in accordance with Moore's Law.

One adverse effect of lateral scaling is that the support for low leakage and high voltage devices, both of which are important in SoC applications, becomes more difficult due to the architecture of high voltage transistors diverging from that of the minimum design-rule (nominal) logic transistor. Lateral scaling also reduces gate-contact spacing, which increases the peak electric field, further reducing a transistor's high voltage operating window.

Peak electric field along a length of a semiconductor channel region in a FET can be modulated through channel doping (e.g., high angle, low energy implantation, etc.). Depending on the gate electrode material, it may also be possible to modulate the field by engineering the gate electrode work function difference relative to the channel semiconductor by tuning the work function value of the gate electrode. For example, polysilicon gate electrodes may have impurities activated to different extents within the gate electrode. In other examples, a gate electrode may be split into two electrodes of different material that electrostatically couple through the gate dielectric to different portions of a channel region. Such structures however are not easily integrated with logic transistors operating at a relatively lower source/drain and/or gate/drain voltage, which do not share the sensitivity to peak electric field.

FET architectures and associated fabrication techniques that enhance high voltage operation of certain transistors without hindering low voltage logic transistor operation are advantageous, particularly for SoC technologies.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements. Further, where considered appropriate, reference labels have been repeated among the figures to indicate corresponding or analogous elements. In the figures.

DETAILED DESCRIPTION

Figure 1A:
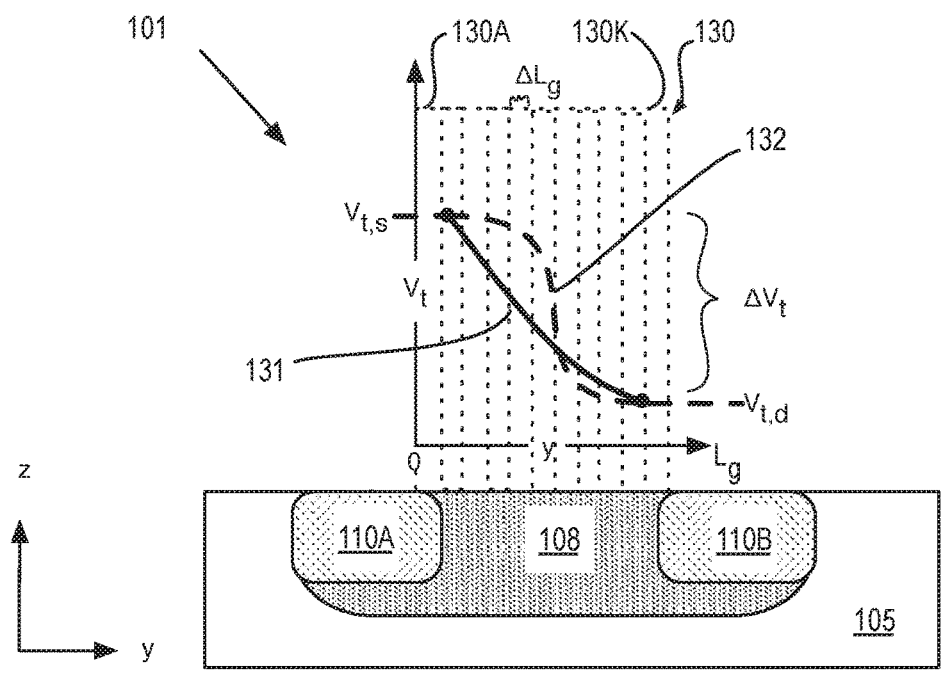
FIG. 1A illustrates lateral modulation of transistor threshold voltage in accordance with embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example up, down, top, bottom, and so on, may be used merely to facilitate the description of features in the drawings. Terms such as "upper" and "lower" "above" and "below" may be understood by reference to illustrated X-Z coordinates, and terms such as "adjacent" may be understood by reference to X,Y coordinates or to non-Z coordinates. Relative positional terms are employed herein merely as labels distinguishing one structural feature from another in a manner that may be more clear than enumerative labels, such as "first," "second," "third," etc.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material layer disposed over or under another may be directly in contact or may have one or more intervening material layers. Moreover, one material disposed between two materials or material layers may be directly in contact with the two layers or may have one or more intervening layers. In contrast, a first material or material layer "on" a second material or material layer is in direct contact with that second material/material layer. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Monolithic semiconductor devices employing laterally graduated gate metal work functions, as well as exemplary techniques to fabricate such structures, are described herein. In embodiments, a gate metal work function is graduated between source and drain edges of the gate electrode for improved high voltage performance. In embodiments, thickness of a gate metal graduates from a non-zero value at the source edge to a greater thickness at the drain edge. In further embodiments, a high voltage transistor with graduated gate metal thickness is integrated with another transistor employing a gate electrode metal of nominal, non-graduated thickness. In embodiments, a method of fabricating a semiconductor device includes graduating a gate metal thickness between a source end and drain end by recessing the first gate metal relative to the surrounding dielectric material non-uniformly within the first opening.

FIG. 1A illustrates lateral modulation of transistor threshold voltage in accordance with embodiments. As shown, field effect transistor 101 includes a semiconductor source region 110A separated from a semiconductor drain region 110B by a semiconductor channel region 108, all disposed over a substrate 105. Channel region 108 may be substantially undoped (i.e., not intentionally doped relative to substrate 105). However, in the exemplary embodiment, channel region 108 has a nominal doping level of a certain conductivity type (e.g., p-type) while source, drain regions 110A, 110B have a nominal doping level of the complementary conductivity type (e.g., n-type). Substrate 105 may be any substrate suitable for forming an IC, such as, but not limited to, a semiconductor substrate, semiconductor-on-insulator (SOI) substrate, or an insulator substrate (e.g., sapphire), the like, and/or combinations thereof. In one exemplary embodiment, substrate 105 includes a substantially monocrystalline semiconductor, such as, but not limited to, silicon. Exemplary semiconductor compositions also include group IV systems, such as silicon, germanium, or an alloy thereof; group III-V systems, such as GaAs, InP, InGaAs, and the like; or group III-N systems, such as GaN.

A gate electrode including a gate metal 130 is disposed over channel region 108 with a gate dielectric film (not illustrated) disposed there between. In embodiments herein, gate metal 130 1 is at least partially responsible for setting the gate electrode work function, and this work function is graduated laterally (e.g., in they-dimension), over the gate electrode length $L_g$. Modulation of the gate electrode work function impacts threshold voltage $V_t$ of transistor 101. FIG. 1A further illustrates gate metal 130 divided into a plurality of slices 130A-130K over the gate electrode length $L_g$ between source region 110A and drain region 110B. If each slice 130A-130K is considered a separated gate electrode having an incremental gate length $\Delta L_g$, an impact on threshold voltage $V_t$ over $\Delta L_g$ can be seen as a function of the modulation of gate metal work function in accordance with embodiments herein. In the exemplary embodiment advantageous for high voltage transistor applications (e.g., gate/drain voltage greater than 3V), the gate metal work function at a source edge of gate electrode 130 (e.g., slice 130A) is associated with a threshold voltage $V_{t,s}$ that is significantly higher than a threshold voltage $V_{t,d}$ associated with the gate metal workfunction at the drain edge (e.g., slice 130K). Although transistor 101 may be associated with a single effective threshold voltage, for example limited to $V_{t,s}$, the reduction in $V_t$ proximal the drain edge illustrated in FIG. 1A reduces the electric field near drain 110B, mitigating the hot electron effect, which can be a dominant transistor failure mechanism as operating voltage increases for a given $L_g$. As described further below, the gate metal work function is graduated to achieve a $\Delta V_t$ over $L_g$ that is advantageously at least 100 mV, more advantageously is at least 200 mV, and may be 250 mV, or more. In further embodiments, a graduation of gate metal work function over $L_g$ can provide a $V_t$ that monotonically decreases from $V_{t,s}$ to $V_{t,d}$, to reach a desired $\Delta V_t$. The $V_t$ may be monotonically decreased either in a gradual manner as illustrated by solid line 131, or in a more abrupt manner approximating step function as illustrated by dashed line 132.

Figure 1B:
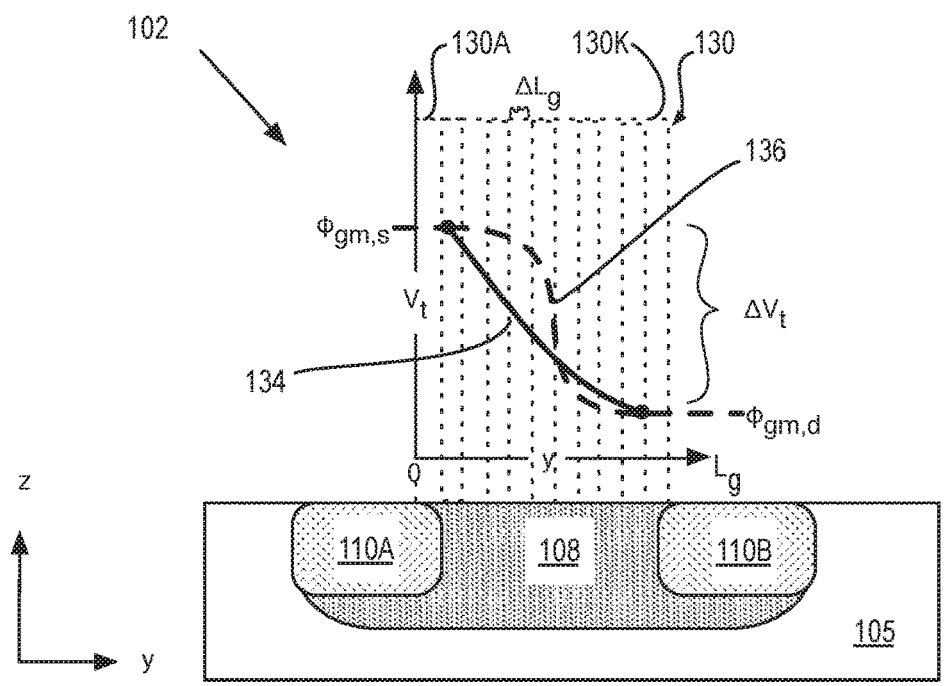
FIG. 1B illustrates an exemplary nMOS transistor with laterally graduation work function, in accordance with embodiments.

FIG. 1B illustrates an exemplary nMOS transistor 102 having n-type source and drain regions 110A, 110B and p-type channel region 108. Gate metal 130 has a gate metal work function $\varphi_{gm}$ that varies over $L_g$ to provide the modulation of $V_t$ illustrated in FIG. 1A. The gate metal work function $\varphi_{gm}$ is monotonically decreased over $L_g$ from $\varphi_{gm,s}$ to $\varphi_{gm,d}$, to reach a desired $\Delta V_t$ with a uniform (constant) channel semiconductor work function. As described further below, the gate metal work function $\varphi_{gm}$ may be monotonically decreased either in a gradual manner as illustrated by solid line 134, or in a more abrupt manner approximating step function as illustrated by dashed line 136. In alternate pMOS embodiments where source and drain regions 110A, 110B are p-type, and channel region 108 is n-type, the gate metal work function $\varphi_{gm}$ monotonically increases from a first work function value proximal to the source region to a second work function value proximal to the drain region to similarly reduce in $V_{t,d}$ relative to $V_{t,s}$ as illustrated in FIG. 1A.

Figure 2A:
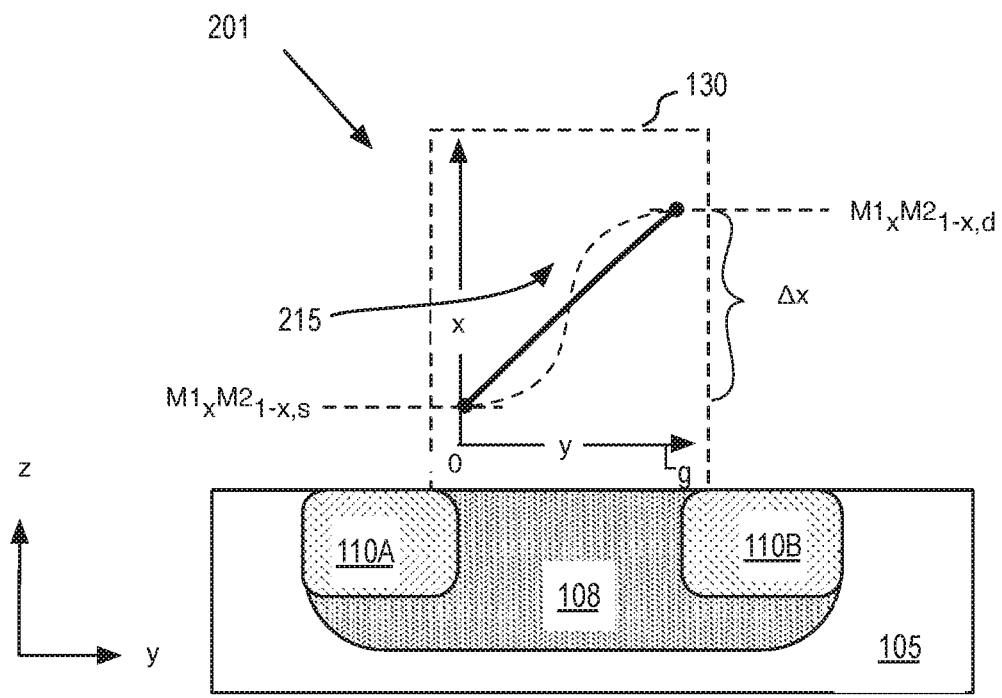
FIG. 2A illustrates lateral modulation of gate metal composition to vary work function in accordance with embodiments.

In an embodiment, an alloy composition of the gate metal is modulated over the length of a gate electrode to laterally graduate the gate metal work function in the desired direction (e.g., from/to source, to/from drain). FIG. 2A illustrates a lateral modulation of gate metal composition to vary the work function of gate electrode 331 in a transistor 201, in accordance with an exemplary embodiment. In this exemplary embodiment, a gate metal binary alloy composition includes a first metal (M1) and a second metal (M2). The atomic fraction x of M1 is varied as a function of lateral distance from a source region 110A to drain region 110B. In advantageous embodiments, the atomic fraction x of each constituent in the gate metal alloy is non-zero across the entire gate length $L_g$. In the exemplary embodiment illustrated, atomic fraction x of M1 increases from a first non-zero value at the source edge of gate electrode 130 (e.g., y=0) to a second non-zero value at the drain edge of gate electrode 130 (e.g., y=Lg), while atomic fraction 1−x of M2 decrease from a first non-zero value at the source edge of gate electrode 130 to a second non-zero value at the drain edge of gate electrode 130. As described further below, the non-zero concentration of M1 at both the source and drain edge may advantageously enable integration of a first transistor having a gate electrode with a laterally graduated gate metal work function with a second transistor having a gate electrode employing some nominal gate metal work function that is substantially constant over gate length. In further embodiments, atomic fraction x of M1 monotonically increases from source edge to drain edge, for example as illustrated by any of curves 215 (e.g., solid line representing a linear graduation of x as function of distance from source region 110A and the dashed line approximating a step function in x). Alloy composition may range widely depending on the work functions of M1 and M2, and depending on the conductivity type of transistor 201 (nMOS or PMOS). Atomic fraction of the constituent with the largest work function may be decreased or increased with greater lateral distance from source region 110A to laterally graduate the gate electrode metal work function in the desired direction. Any metal known to be suitable as a gate electrode (e.g., of sufficiently low resistance, having sufficient thermal stability, etc.) may be selected as metal M1 and metal M2. Exemplary metals include tungsten (W), cobalt (Co), nickel (Ni), molybdenum (Mo), tantalum (T), titanium (Ti), tin (Sn), aluminum (Al), and platinum (Pt). Gate metal alloys may include two or more of these exemplary metals. One or more additional additive (such as, but not limited to carbon, silicon, and nitrogen) may be further incorporated into the gate metal alloy. Gate metal may alloys may also include one of these exemplary metals alloyed with any other metal, with or without additives, (such as, but not limited to carbon, carbon, silicon, and nitrogen).

Figure 2B:
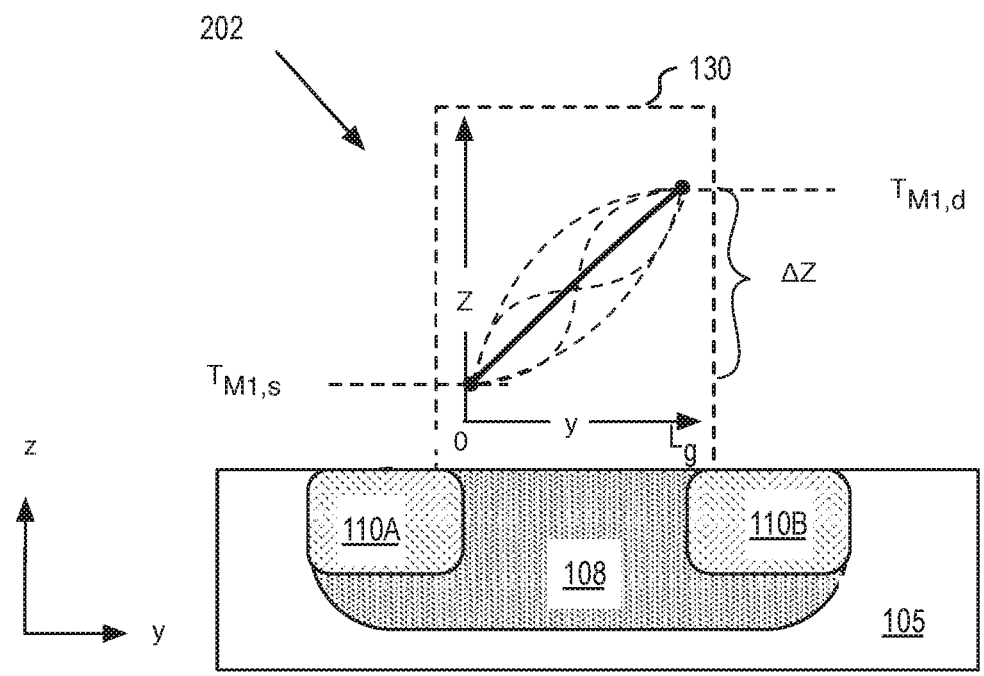
FIG. 2B illustrates lateral graduation of gate metal thickness to vary work function in accordance with embodiments.

In an embodiment, the film thickness of a gate metal is graduated over the length of a gate electrode to laterally graduate the gate metal work function. FIG. 2B illustrates a lateral graduation of gate metal thickness to vary the work function of gate electrode 130 in transistor 202. In this exemplary embodiment, the thickness of a first gate metal M1 increases monotonically over the length of the first gate electrode from a source edge thickness $T_{M1,s}$ proximal source region 110A to a drain edge thickness $T_{M1,d}$ proximal drain region 110B. In such embodiments, at least one of the source edge thickness and drain edge thicknesses is below a critical thickness above which the work function is independent of the metal film thickness. In exemplary embodiments where this critical thickness is approximately 100 nm, at least the source edge thickness $T_{M1,s}$ is less than 100 nm. In further embodiments, both the source edge thickness and drain edge thickness of the gate metal is less than 100 nm.

In embodiments, the difference between source edge thickness $T_{M1,s}$ and drain edge thickness $T_{M1,d}$ (i.e., $\Delta$z-height) is advantageously at least 10%, is more advantageously at least 20%, and may exceed 25%. For example, the drain edge thickness $T_{M1,d}$ in FIG. 2 may be at least 10% greater than the source edge thickness $T_{M1,s}$. In certain embodiments, threshold voltage is a linear function of gate metal work function, and gate metal work function is a linear function of a first metal thickness. In one advantageous embodiment, a first gate metal at a source edge thickness $T_{M1,s}$, is associated with a $V_t$ that is at least 100 mV lower than a second $V_t$ associated with the first gate metal at the drain edge thickness $T_{M1,d}$. In further embodiments, a first gate metal has a drain edge thickness $T_{M1,d}$ that is at least 10% greater than the source edge thickness $T_{M1,s}$, and the drain edge has a corresponding $V_t$ that is at least 100 mV lower than the source edge. (i.e., 50 mV change in $V_t$ per 5% change in gate metal z-height).

Notably, the embodiments illustrated by FIGS. 2A and 2B are compatible with each other and in one advantageous embodiment, a gate metal alloy composition is laterally modulated by laterally graduating the thickness of a least one metal film that is subsequently alloyed with another metal film disposed over the thickness-graduated film. An as-deposited thickness variation may be utilized to vary the atomic fraction of the alloy constituents, as further described below.

Figure 3A:
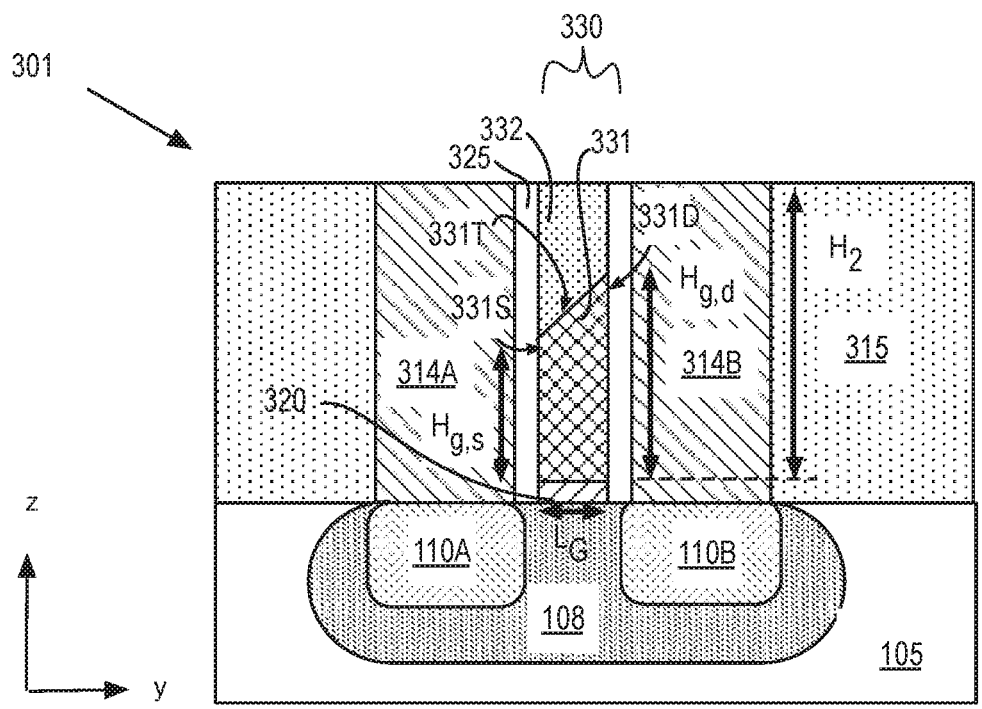
FIG. 3A and FIG. 3B illustrate cross-sectional views of a MOSFET employing a gate metal having a laterally graduated work function, in accordance with embodiments.

FIG. 3A is a cross-sectional view of a MOSFET 301 employing a gate stack 330 including a gate metal with a laterally graduated work function, in accordance with embodiments. The cross-sectional view illustrated in FIG. 3A is applicable to both planar and non-planar (e.g., fin) MOSFET structures. Structural differences between planar and non-planar embodiments would be more apparent along an axis out of the plane illustrated in FIG. 3A, but are not illustrated as embodiments herein are independent of such features and therefore equally applicable to planar and non-planar FET technologies.

MOSFET 301 includes semiconductor source, drain regions 110A, 110B, channel region 108, and substrate 105, substantially as described above. As further illustrated, a source contact 314A interfaces with source region 110A, and a drain contact 314B interfaces with drain region 110B. Contacts 314A, 314B may utilize any contact metallization known to be compatible (e.g., provides good ohmic behavior) with the composition of semiconductor source, drain regions 110A, 110B.

Contact metallization is surrounded by dielectric materials 315, 325. Isolation dielectric 315 and intervening spacer dielectric 325 may be any known dielectric materials, such as, but not limited to, silicon oxides (SiO), silicon nitrides (SiN), silicon oxynitrides (SiON), silicon carbonitrides (SiCN), or low-k materials (e.g., carbon doped silicon dioxide (SiOC), porous dielectrics, etc.). Spacer dielectric 325 is of a nominal lateral (e.g., y-dimension) thickness, for example, 20 nm, or less, in advanced CMOS technology. Isolation dielectric 315 may be any thickness (e.g., z-dimension) to accommodate planarization with gate electrode capping material 332, and/or source, drain contacts 314A, 314B.

A gate dielectric 320 is disposed over channel region 108. Gate dielectric 320 may be any material and have any thickness known to provide suitable function within a MOS stack. Materials such as silicon dioxide ($SiO_2$), silicon nitride ($Si_3N_4$), silicon oxynitride (SON), having bulk dielectric constants in the range of 3.9 to about 8, may be utilized for gate dielectric 320. In advantageous embodiments however, gate dielectric 320 is a high-k dielectric material have a bulk dielectric constant of at least 10. Exemplary high-k materials include, but are not limited to, metal oxides (e.g., $HfO_2$), and metal silicates. Gate dielectric 320 may also be a laminate stack of more than one dielectric (e.g., two or more thin films of the above materials). Gate dielectric 320 may have a range of physical thicknesses, which may be a function of dielectric composition as limited by typical MOS stack parameters, such as leakage current, etc. In exemplary embodiments, gate dielectric 320 is of a nominal thickness dependent upon its bulk relative permittivity to achieve a desired equivalent oxide thickness (EOT), for example, 10 nm, or less.

In embodiments, a gate work function metal has a z-height from its interface with an underlying gate dielectric that varies over gate length $L_g$. This variation in work function metal z-height may provide any of the variations in work function metal thickness described above. For example, the z-height of a gate work function metal may vary by 10%-20%, or more, over gate length $L_g$. The gate work function metal in exemplary embodiments is in direct contact with the gate dielectric, however it may also be separated from the gate dielectric by one or more other materials, such as another gate work function metal that does not have significant z-height variation. In the embodiment illustrated in FIG. 3A, gate metal 331 interfaces with gate dielectric 320, and has a non-zero minimum z-height $H_{g,s}$ at the gate electrode source edge 331S. Z-height of gate metal 331 monotonically increases in a gradual manner to a maximum z-height $H_{g,d}$ at gate electrode drain edge 331D. The maximum z-height $H_{g,d}$ may vary, but in an exemplary embodiment is no more than 100 nm. As further illustrated in FIG. 3A, drain edge z-height $H_{g,d}$ is less than a corresponding z-height of spacer dielectric 325 (e.g., z-height $H_2$ measured from a same reference plane as $H_{g,d}$). In further embodiments, drain edge z-height $H_{g,d}$ is also less than a corresponding z-height of isolation dielectric 315 (e.g., also z-height $H_2$ measured from a same reference plane as $H_{g,d}$). In embodiments, the source edge z-height $H_{g,s}$ is less than a corresponding z-height of spacer dielectric 325. In further embodiments, source edge z-height $H_{g,s}$ is also less than a corresponding z-height of isolation dielectric 315 (e.g., z-height $H_2$ measured from a same reference plane as $H_{g,d}$). In embodiments, both the source edge z-height $H_{g,s}$ and drain edge z-height $H_{g,s}$ of gate metal 331 is less than a corresponding z-height of spacer dielectric 325.

In embodiments, a gate stack further includes a gate capping material disposed over a gate workfunction metal of graduated thickness. In the exemplary embodiment illustrated in FIG. 3A, gate stack 330 includes a gate capping material 332 disposed over gate metal 331. Gate capping material 332 has a top surface substantially planar with a top surface of spacer dielectric 325, bringing the z-height of gate stack 330 to be substantially equal to the z-height of spacer dielectric 325 (e.g., equal to z-height $H_2$). Gate capping material 332 may be a metal, a semiconductor, or a dielectric.

For metal and semiconductor embodiments, gate capping material 332 may, but need not, alloy with gate metal 331. In other embodiments a diffusion barrier layer (e.g., TaN) may be disposed between a metal gate capping material 332 and gate metal 331. For embodiments where gate capping material 332 alloys with gate metal 331, the variation in z-height (thickness) of gate metal 331 illustrated in FIG. 3A may provide the basis for laterally modulating the composition of a gate metal alloy. For example, solid state diffusion between gate metal 331 and a metal gate capping material 332 may occur to form a metal alloy with a composition that is a function of the relative proportion of z-height $H_2$ attributable to each of gate metal 331 and gate capping material 332. Because of the planar top surface of gate capping material 332, the variation in z-height of gate metal 331 controls the volumetric proportions of a resulting gate metal alloy. For embodiments where gate metal 331 and gate capping material 332 alloy, the interface 331T between gate metal 331 and gate capping material 332 illustrated in FIG. 3A is representative of an "as-deposited" state, prior to a thermal anneal. Exemplary gate capping metals and semiconductors, include, but are not limited to, polysilicon, W, Cu, Ti, Al, Ni, Co, their alloys, and carbides.

For dielectric embodiments, gate capping material 332 may provide electrical isolation over a top surface of gate metal 331. A dielectric gate capping material 332 may have a same composition as one or more of gate dielectric 320, isolation dielectric 315, and spacer dielectric 325, or may have a composition distinct from any and/or all other dielectrics allowing for etch selectively between materials. In exemplary embodiments, gate capping material 332 includes one or more of: SiO, SiON SiN, SiCN, SiC, low-k dielectric (e.g., carbon-doped oxide), or the like. For embodiments where gate capping material 332 is a dielectric, lateral work function graduation may be a direct result of the illustrated thickness variation in metal 331, as described above in the context of FIG. 2B. Lateral work function graduation may also be an indirect result of the illustrated thickness variation in metal 331 where a second work function metal of substantially constant thickness is disposed between gate metal 331 and gate dielectric 320. For such embodiments, a gate metal alloy composition may be modulated on the basis of the thickness, or z-height, variation of metal 331, substantially as described above in the context of a metal gate capping material 332. Hence, whether gate metal 331 is the only work function metal in gate electrode stack 330, or is one of two or more metal films (e.g., including an overlying metal gate capping material 332, and/or an underlying metal not depicted), the variation in thickness of metal 331 over the gate length $L_g$ laterally graduates the effective work function of the electrode within gate electrode stack 330.

Figure 3B:
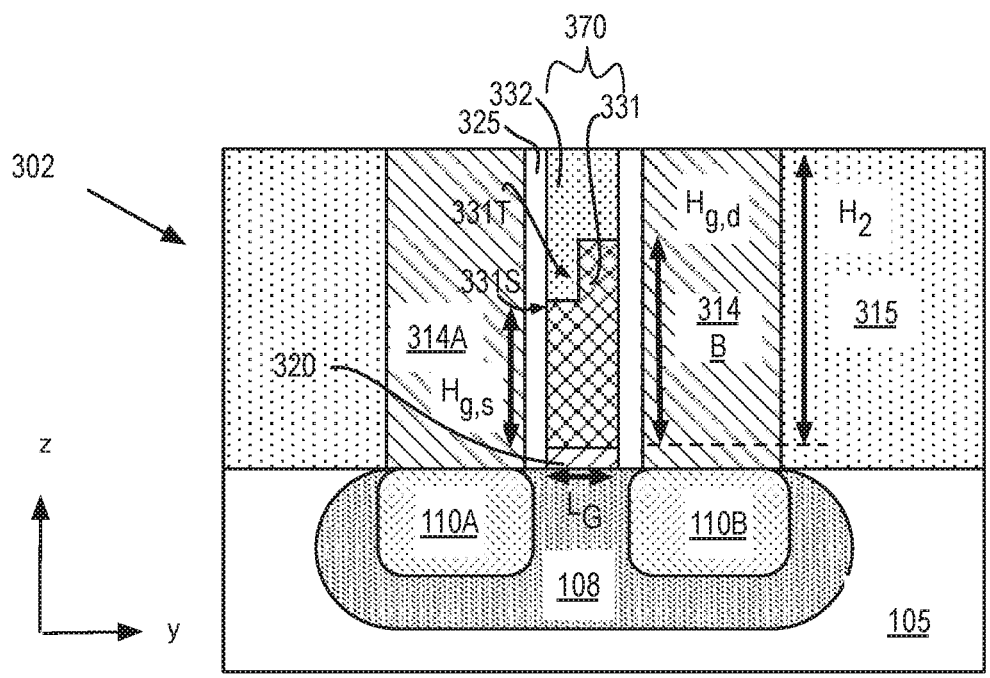

Variation in work function metal z-height may be gradual, as illustrated in FIG. 3A, or may be a step function between two non-zero values, as illustrated in FIG. 3B. In FIG. 3B, MOSFET 302 includes a gate metal 331, which has a discrete step in z-height (metal thickness) between source edge ($H_{g,s}$) and drain edge ($H_{g,d}$) of the gate electrode stack 370. Fabrication techniques for forming either the gradual metal thickness profile of FIG. 3A or step function metal thickness profile of FIG. 3B is described further below.

In embodiments, a semiconductor device includes a first transistor with a gate electrode metal that has a laterally graduated work function, and a second transistor with a gate electrode metal having a work function that varies over the gate electrode length by a lesser amount (e.g., is non-graduated). In further embodiments, a semiconductor device includes a first transistor with a gate electrode metal with a laterally graduated thickness, and a second transistor with a gate electrode metal having a thickness that varies over the gate electrode length by a lesser amount (e.g., is non-graduated). In advantageous embodiments, gate electrode thickness variation along the gate length is dependent on a dimension of a gate electrode. A gate electrode having a nominal gate length below a threshold may lack a monotonic increase in metal thickness between source and drain edges, while a gate electrode having a gate length above the threshold has a monotonic increase in metal thickness between source and drain edges (e.g., from source edge to drain edge).

Figure 4:
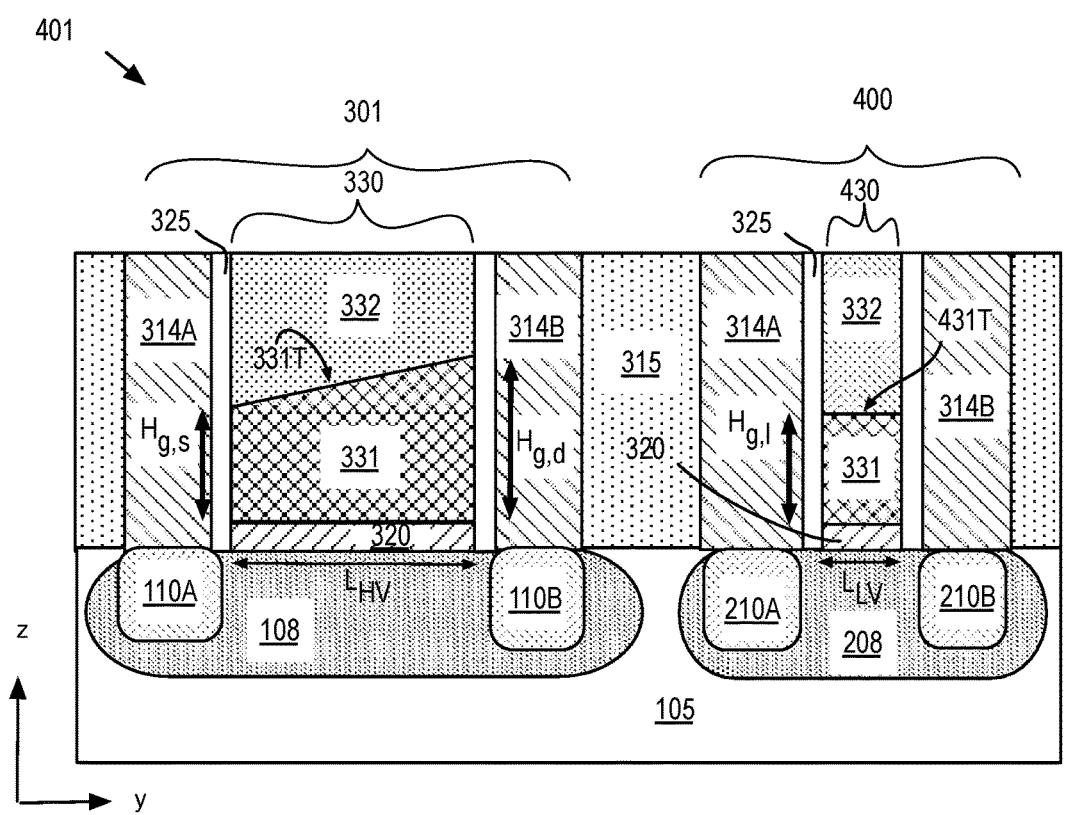
FIG. 4 is a cross-sectional view of a MOSFET employing a gate metal having a laterally graduated work function integrated with a MOSFET employing a gate metal having a non-graduated work function, in accordance with an embodiment.

FIG. 4 is a cross-sectional view of semiconductor device 401 including a MOSFET 301 employing a gate metal having a laterally graduated work function integrated with a MOSFET 400 employing a gate metal having a nominal work function, in accordance with an embodiment. MOSFET 301 may have any and all of the structural features described above in reference to FIG. 3A.

MOSFET 400 further includes a semiconductor channel region 208 disposed over another portion of substrate 105. Semiconductor channel region 208 may have the same conductivity type as that of semiconductor channel 108, or may be of the complementary type. MOSFET 400 further includes a semiconductor source region 210A, and a drain region 210B, each being of a conductivity type complementary to channel region 208. Source, drain regions 210A, 210B are disposed over substrate 105 on opposite sides of channel region 208, for example as regrown/raised semiconductor regions. In the exemplary embodiment where channel region 208 has the same conductivity type as channel region 108, source and drain regions 210A, 210B have the same conductivity type (e.g., n-type) as source, drain regions 110A, 110B. In a further embodiment, the source and drain regions 110A, 110B, and 210A, 210B are all of substantially the same composition (e.g., doped to same impurity level, etc.). MOSFET 400 further includes a source contact 314A interfacing with semiconductor source region 210A, and a drain contact 314B interfacing with semiconductor drain region 210B. MOSFET 400 further includes gate dielectric 320.

MOSFET 400 further includes a gate electrode stack 430 separated from channel region 208 by gate dielectric 320. Gate electrode stack 430 is further separated from the source and drain contacts 314A, 314B by intervening spacer dielectric 325. As illustrated in FIG. 4, gate electrode stack 430 includes gate metal 331, and gate capping material 332 substantially as described above for MOSFET 301, however gate metal 331 is substantially planar and has a nominal z-height of $H_{g,l}$, lacking the monotonic z-height increase between $H_{g,s}$ and $H_{g,d}$. In advantageous embodiments, gate electrode stack 430 has the same material composition(s) as gate electrode stack 330 (i.e., same gate metal 331 and same gate capping material 332). In further embodiments, gate metal 331 thickness or z-height monotonically increases above a threshold gate electrode length. Below the threshold, gate metal 331 thickness or z-height does not monotonically increase from edge-to-edge of the gate electrode. Gate electrode stack 330 may be designed to have a larger lateral critical dimension (CD) than does gate electrode stack 430. The larger lateral gate length $L_{HV}$ illustrated in FIG. 4 is suitable for high voltage (HV) transistors, which may have gate lengths of a few tens to many hundreds of nanometers. The smaller lateral gate length $L_{LV}$ illustrated in FIG. 4 is suitable for logic transistors, which may have gate lengths on the order of 10 nm. As described further below, correlation between gate length and thickness of gate metal 331 advantageously enables HV transistors with a laterally graduated gate metal work function to be integrated with lower voltage logic transistors lacking lateral work function graduation.

In an embodiment, the thickness of gate metal 331 increases from a non-zero thickness value $H_{g,s}$ at a source edge gate electrode stack 330 to a thickness value $H_{g,d}$ at a drain edge that is at least 10% greater (more advantageously at least 20%) than the source edge thickness value $H_{g,s}$. However, gate metal 331 also has a thickness that varies by less than 10% between source and drain edges of the gate electrode stack 430. The nominal thickness of gate metal 331 in gate electrode stack 430 may be greater than, approximately equal to, or less than the source edge thickness value $H_{g,s}$ in gate electrode stack 330 depending on the fabrication techniques employed. In the exemplary embodiment depicted, gate metal 331 in gate electrode stack 430 has an average thickness $H_{g,l}$ that is less than the source edge thickness value $H_{g,s}$ in gate electrode stack 330.

Figure 5A:
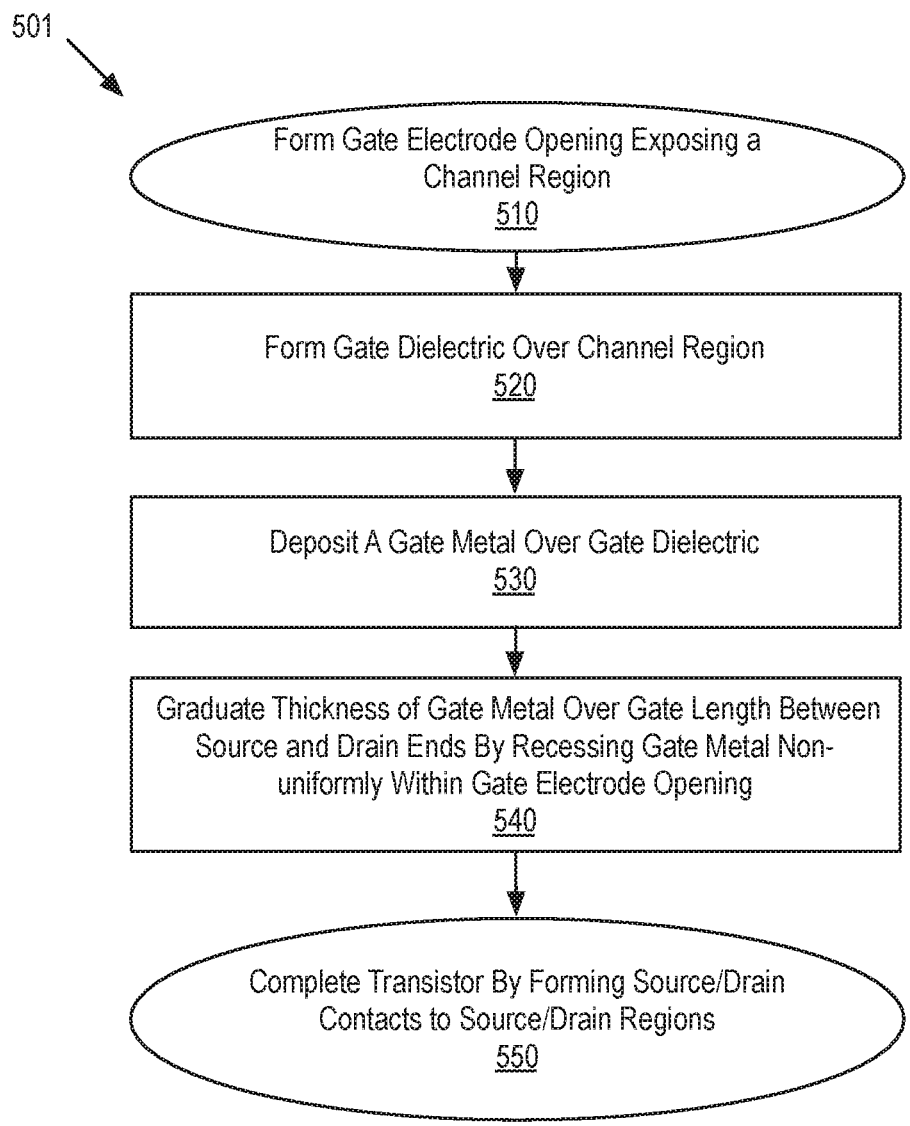
FIG. 5A is a flow diagram illustrating a method of forming a transistor including a gate metal with a laterally graduated work function, in accordance with an embodiment.

In an embodiment, gate metal lateral work function modulation is a feature dependent on the process of forming a gate electrode. Transistor structures with gate electrodes that employ gate metal with lateral work function graduation may be fabricated with a wide variety of techniques. FIG. 5A is a flow diagram illustrating a method of forming a MOS transistor with gate metal having a laterally gradated work function, in accordance with an embodiment. Method 501 may be practiced to fabricate MOSFET 301 or 302 illustrated in FIGS. 3A and 3B, for example.

Method 501 begins with forming an opening in dielectric material layer(s) at operation 510. The opening may expose a semiconductor channel region of a substrate. Any known technique(s) may be practiced at operation 510 to form an opening into which a gate electrode is to be subsequently deposited. One technique includes removing a sacrificial gate electrode from a surrounding structure, as described further below in the context of FIG. 5C and FIG. 6A-6D. Other techniques such as, but not limited to, patterned etching of a blanket dielectric film, may also be practiced. Thickness or z-height of the surrounding dielectric and CD of the opening may be selected to provide a desired aspect ratio (AR) during subsequent backfilling of the opening with a gate electrode metal and recessing of the backfilled gate electrode metal.

At operation 520, a gate dielectric layer is formed over the semiconductor channel region exposed within the opening formed at operation 510. Any known gate dielectric formation process may be employed at operation 520 (e.g., thermal oxidation, CVD, and ALD) to form any material known to be suitable as a MOS dielectric. In advantageous embodiments, operation 520 entails ALD of a high-k material.

Method 501 continues at operation 530 with formation of a gate metal within the opening formed at operation 510. In exemplary embodiments, operation 530 entails depositing a gate work function metal with a nonconformal process, such as, but not limited to, sputtering, a conformal process, such as, but not limited to, CVD and ALD, or a superfilling process, such as, but not limited to spin-on, electrolytic plating, or electroless plating.

Method 501 continues at operation 540 where the gate metal deposited at operation 530 is recessed non-uniformly within the opening. The non-uniform etch back may graduate the thickness of the gate metal over the gate length in accordance with any of the examples described above in the context of FIG. 1A-FIG. 4. Operation 540 may entail one or more known recess etch process as a function of the gate metal composition. In embodiment, operation 540 includes an anisotropic plasma-based recess etch and/or an isotropic wet chemical-based recess etch, depending on the gate metal thickness profile desired. In further embodiments, operation 540 entails planarization of the gate metal to remove deposited gate metal overburden followed by the non-uniform recess etch. Such embodiments are further described below in the context of FIG. 5B and FIG. 5C. Method 501 ends at operation 550 where the transistor is completed by forming source/drain regions, and forming source/drain contacts to the source/drain regions, with any known technique(s). If a gate metal alloy is to be formed, a thermal anneal may be performed, for example during a source/drain regrowth, etc.

Figure 5B:
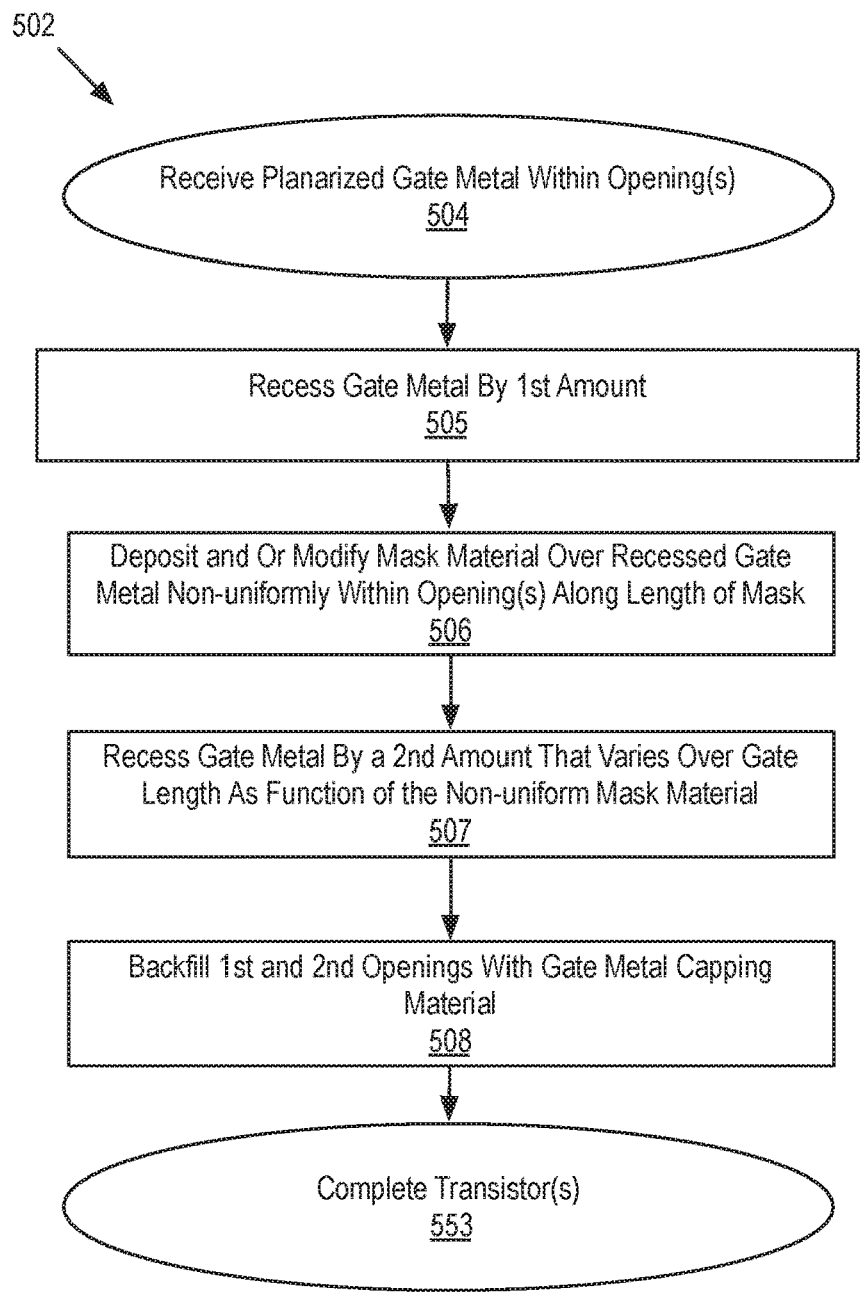
FIG. 5B is a flow diagram illustrating a method of graduating the thickness of a gate metal over a gate length between source and drain ends, in accordance with an embodiment.

FIG. 5B is a flow diagram illustrating a method 502 of graduating the thickness of a gate metal over a gate length between source and drain ends, in accordance with an embodiment. Method 502 is a specific embodiment of operation 540 in method 501, and may be practiced to fabricate MOSFET 301 or 302 illustrated in FIGS. 3A and 3B, for example.

Method 502 begins at operation 504 with receiving a planarized gate metal disposed within openings in a surrounding dielectric. At operation 505, the gate metal is recessed by a first amount relative to the surrounding dielectric. Any etch back etch technique may be employed to recess the gate metal selectively to the surrounding dielectric, such as, but not limited to, a plasma etch process (e.g., employing an oxidizing chemistry such as fluorine, chlorine, bromine, etc.). At operation 506, a mask material is deposited and/or modified non-uniformly over the recessed gate metal. Deposition and/or modification of the mask material may take many forms with the goal being to vary the thickness or quality of a first portion of the mask material disposed over the recessed gate metal selectively to a second portion of the mask material disposed over the recessed gate metal.

While one form of mask modification may be lithographic patterning of a photo resist mask, such a technique may only be suitable for relatively large gate electrode lengths that satisfy lithographic printing constraints. In advantageous embodiments, operation 506 entails self-aligned mask deposition and/or modification techniques. In more advantageous embodiments, operation 506 entails a directional self-aligned deposition and/or mask modification technique, such as, but not limited to, angled deposition and angled implantation. In one embodiment for example, the recessed gate metal may be non-uniformly supplemented with a directional deposition of a second gate metal (which may have the same composition as the recessed gate metal, or a different composition). In another embodiment, a sacrificial mask material is directionally deposited at a predetermined angle so that the recess aspect ratio shadows a portion of the sacrificial mask material deposition. In another embodiment, a sacrificial mask material is directionally modified by an implant performed at a predetermined angle so that the recess aspect ratio shadows a portion of the sacrificial mask material exposure. A more detailed example of an angled implant embodiment is further described below in the context of FIG. 5C.

Method 502 continues at operation 507, where the recessed gate metal is recessed again by an amount that varies over the gate electrode length as a function of the non-uniform mask material. Where a non-sacrificial mask has been directionally deposited at operation 506, operation 507 may be bypassed. In exemplary embodiments, the recessed etch operation 507 is substantially the same as the recess etch practiced at operation 505 in further reliance that the presence of the non-uniform mask formed at operation 506 will laterally graduate the gate metal thickness. The gate metal thickness variation along the gate electrode length may then be utilized to laterally graduate gate metal work function, for example as described above. At operation 508, the openings are backfilled with a gate metal capping material. Method 502 completes with formation of source/drain semiconductor regions and diffusion contact metallization at operation 553, for example using any known techniques.

Figure 5C:
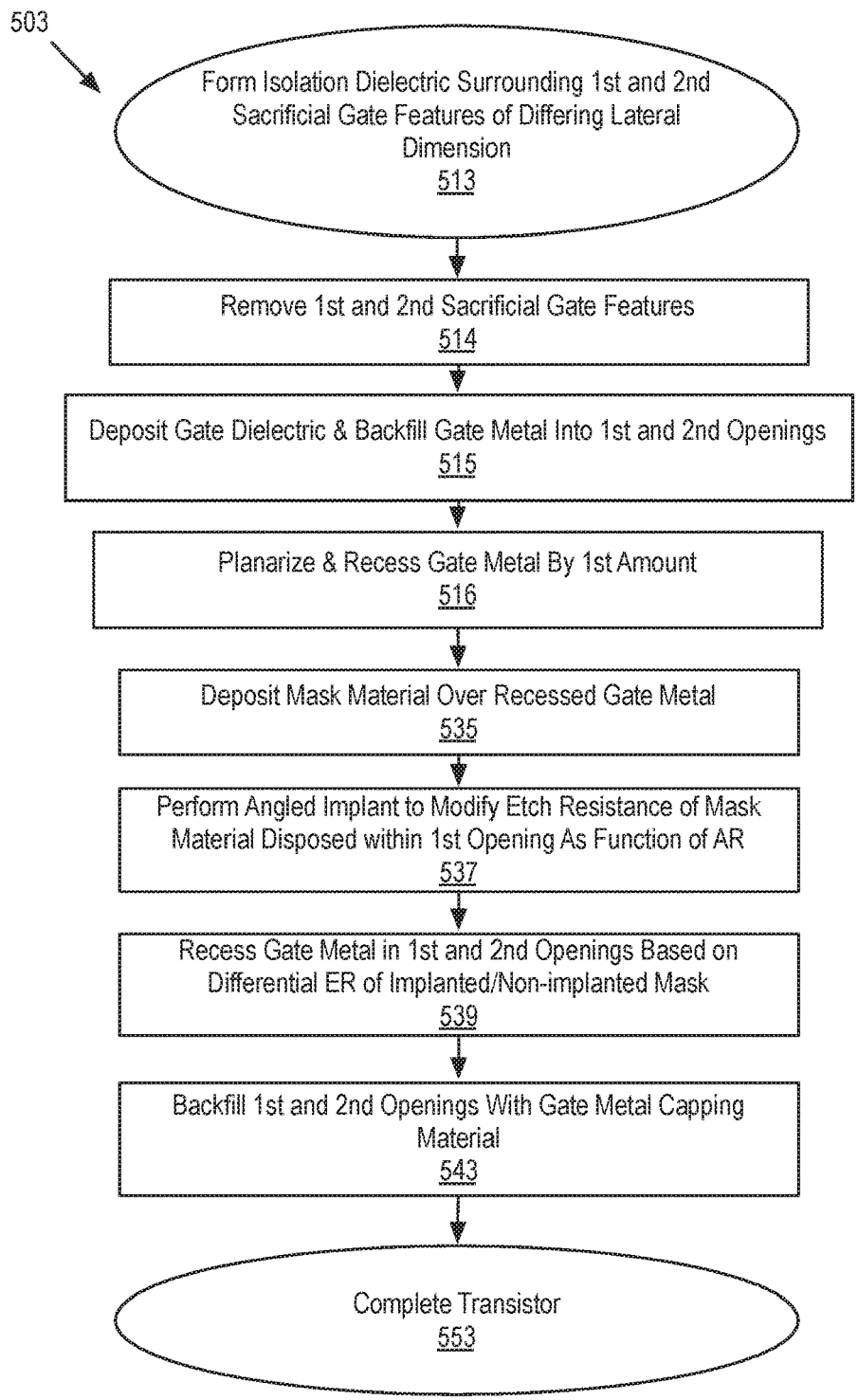
FIG. 5C is a flow diagram illustrating a method of forming a transistor including a gate metal with a laterally graduated work function, and a transistor including a gate metal with a non-graduated work function, in accordance with an embodiment.

FIG. 5C is a flow diagram illustrating a method 503 of forming a transistor including a gate metal with a laterally graduated work function, and a transistor including a gate metal with a non-graduated work function, in accordance with an embodiment. Method 503 may be practiced to fabricate MOSFETS 301 and 400 illustrated in FIG. 4, for example. Certain operations described in the context of method 503 are further illustrated in FIG. 6A-6J. FIG. 6A-6J are cross-sectional views of MOSTFET with laterally modulated gate metal thickness and a MOSFET without laterally modulated gate metal thickness evolving as selected operations in method 503 are performed, in accordance with advantageous embodiments. Reference numbers introduced in FIG. 4. are retained for corresponding structures illustrated in FIG. 6A-6J. The various operations illustrated in more detail by FIG. 6A-6J may be similarly applied in corresponding operations of methods 501 and 502 above.

Referring to FIG. 5C, method 503 begins with forming first and second openings in an isolation dielectric material layer(s) at operation 513. The openings expose two separate semiconductor channel regions of a substrate. Any known techniques may be practiced at operation 513 to form the openings into which a gate electrode is to be subsequently deposited. One technique includes concurrently removing two sacrificial gate electrodes from a surrounding structure. In the exemplary embodiment illustrated in FIG. 6A, a gate replacement process is performed beginning with formation of sacrificial gate structures 630 over channel semiconductor regions 108, 208. Sacrificial gate structures 630 may be fabricated with any known technique. In one embodiment, a sacrificial material, such as, but not limited to polysilicon, is deposited over the substrate and patterned to form a plurality of sacrificial gate structures. Any suitable deposition technique may be utilized, such as, but not limited to chemical vapor deposition (CVD), or atomic layer deposition (ALD). In one exemplary embodiment polysilicon is deposited by CVD. Any suitably anisotropic etch may be utilized to pattern the sacrificial material. Isolation dielectric material 315 is formed around sacrificial gate structures 630. Any deposition process may be employed to form dielectric material 315, such as, but not limited to, CVD, and spin-on processes. For deposition processes that are non-planarizing, the deposited dielectric may be planarized, for example by chemical-mechanical polish (CMP) to expose top surfaces of the sacrificial gate features.

Figure 6A:
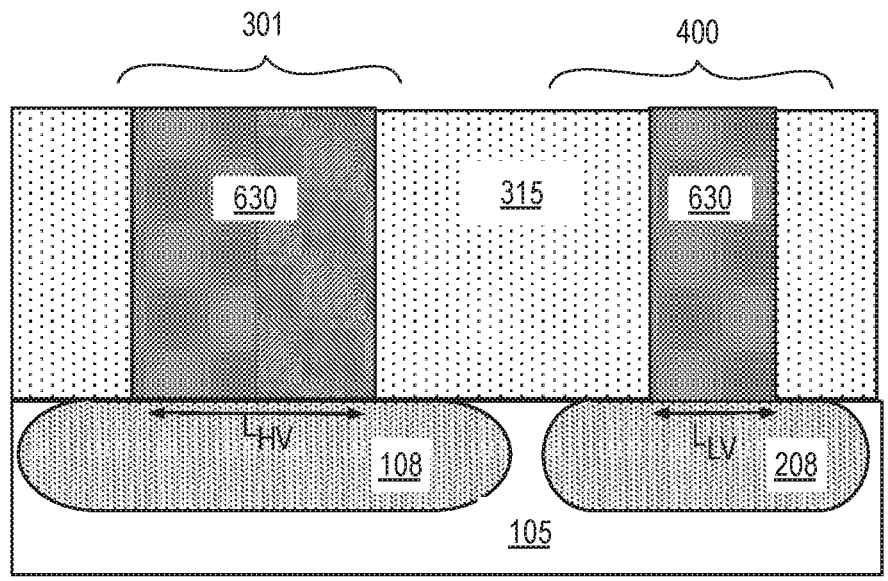
FIGS. 6A, 6B, 6C, 6D, 6E, 6F, 6G, 6H, 6I, and 6J are cross-sectional views of a transistor including a gate metal with a laterally graduated work function, and a transistor including a gate metal with a non-graduated work function evolving as selected operations in the method depicted in FIG. 5C are performed, in accordance with an embodiment.
Figure 6B:
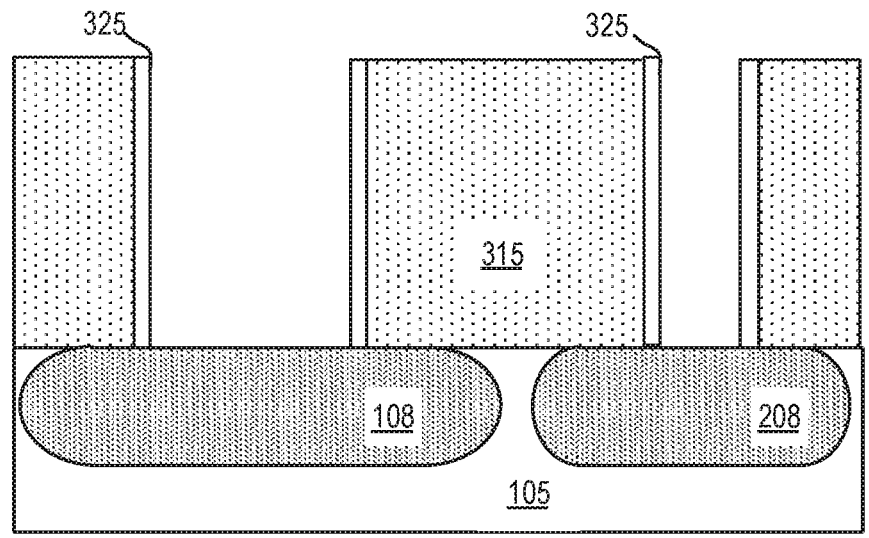
Figure 6C:
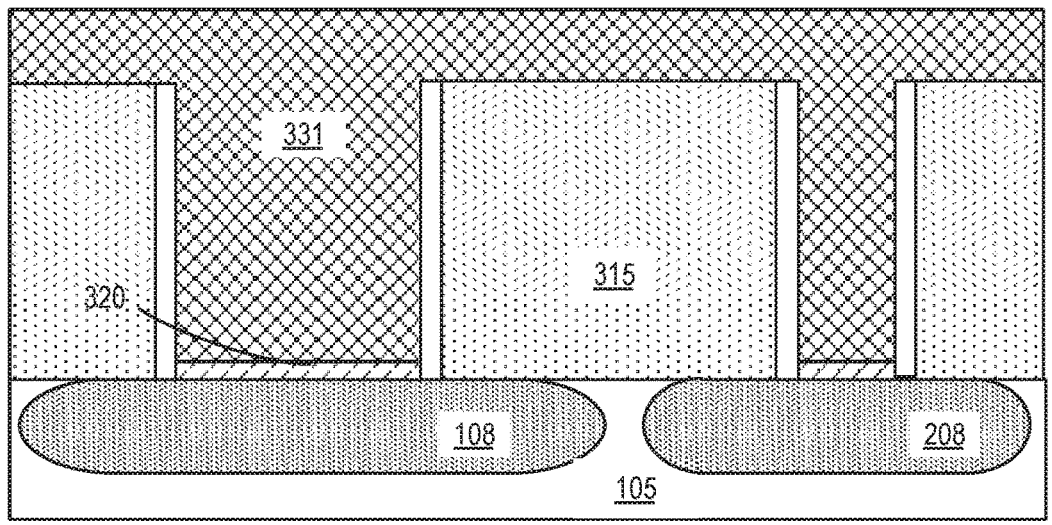
Figure 6D:
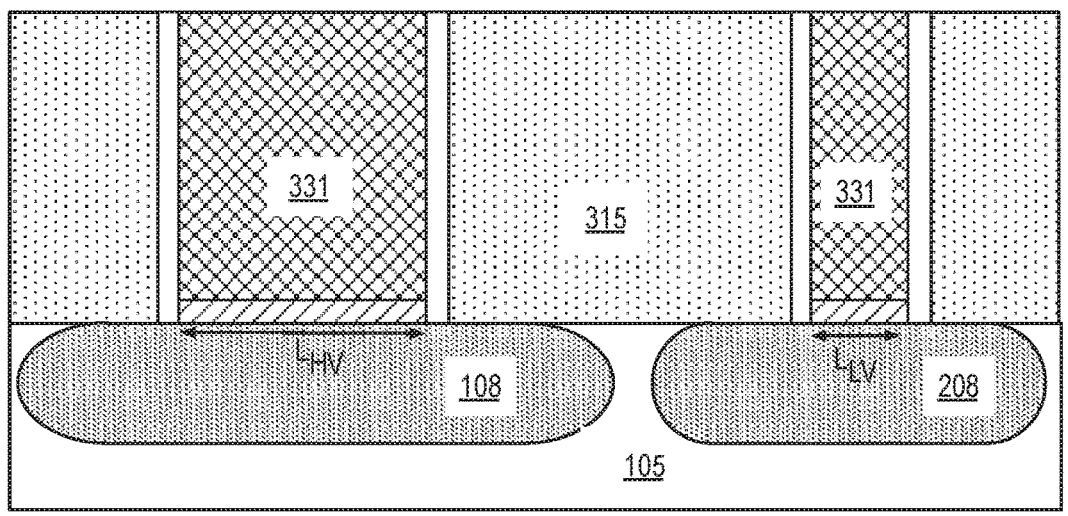

Returning to FIG. 5C, sacrificial gate features are removed at operation 514, as further illustrated in FIG. 6B. Any conventional etch process, such as, but not limited to a wet chemical etch, or dry plasma etch, may be utilized to remove one or more sacrificial gate structure selectively to the surrounding dielectric. Spacer dielectric 325 may be formed by depositing any suitable dielectric material, such as, but not limited to SiO, SiON, SiN, SiOC, etc., with any known technique, such as, but not limited to, chemical vapor deposition (CVD), or atomic layer deposition (ALD). The dielectric material deposition is advantageously conformal. An anisotropic etch may then clear the dielectric material leaving only spacer dielectric 325 self-aligned to topographic steps. In the exemplary embodiment illustrated in FIG. 6B, spacer dielectric 325 is self-aligned to edges of isolation dielectric 315. In alternate embodiments, the formation of isolation dielectric 315 and removal of sacrificial gate structures 630 may be subsequent to the formation of spacer dielectric 325.

Returning to FIG. 5C, the thickness (z-height) of the dielectrics 315, 325, and CD of a first of the gate electrode openings may be selected to enable non-uniform recession of the gate metal subsequently deposited in the openings formed at operation 514. In the exemplary embodiment illustrated in FIG. 6A, a first opening of a larger CD $L_{HV}$ and a second opening of a smaller CD $L_{LV}$ are formed into a surrounding dielectric of a substantially uniform thickness or z-height.

In further reference to FIG. 5C, method 503 continues at operation 515 where a gate dielectric is formed in each of the first and second openings that were formed at operation 513. Any known gate dielectric formation process may be employed at operation 515 (e.g., thermal oxidation, CVD, and ALD) to form any material known to be a suitable MOS dielectric. In an advantageous embodiment further illustrated by FIG. 6C, a high-k gate dielectric 320 is deposited by ALD. Although not depicted, gate dielectric 320 may also form on sidewalls of spacer dielectric 325. Gate metal 331 then concurrently backfills the first and second openings, for example using any of the techniques listed above.

Figure 6E:
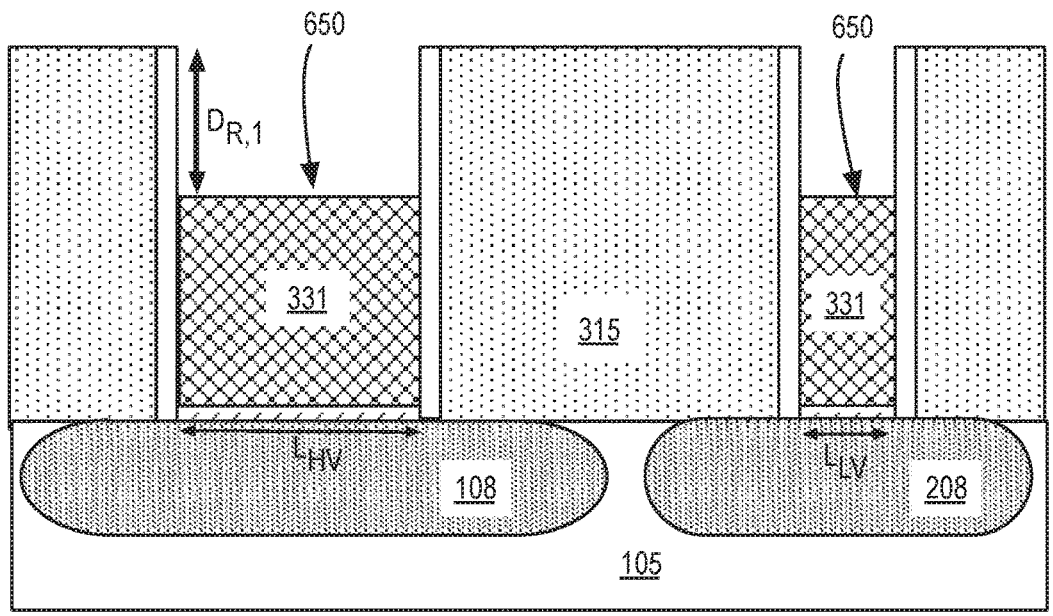
Figure 6F:
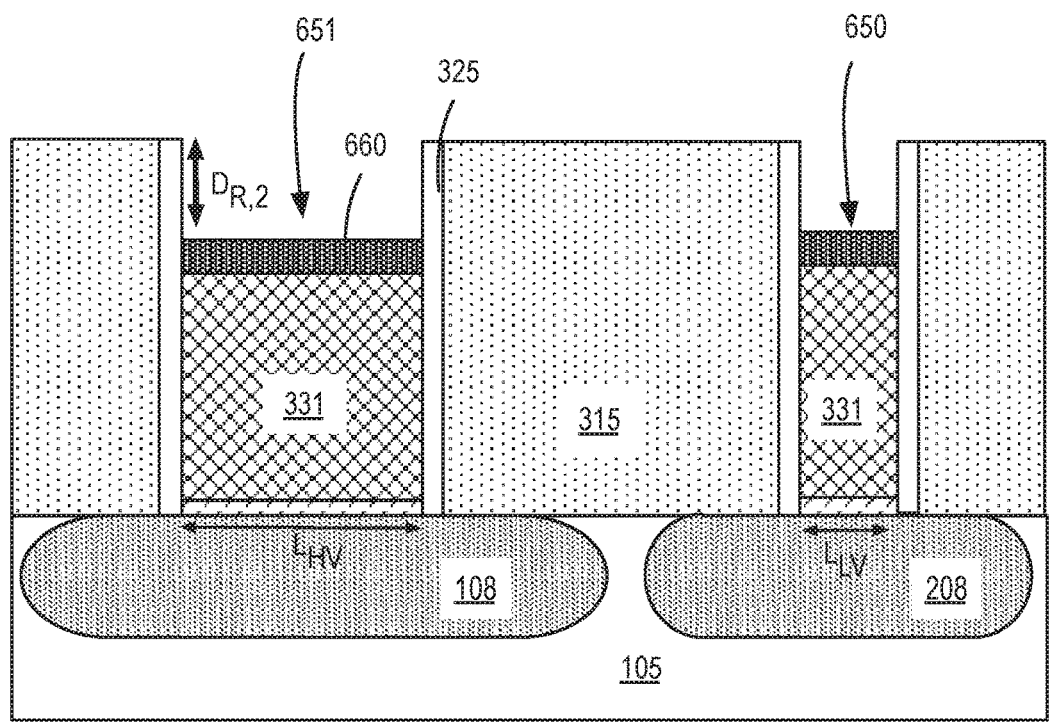

Returning to FIG. 5C, method 503 continues with operation 516, where the gate metal deposited at operation 515 is planarized by any known technique (e.g. CMP). As further illustrated in FIG. 6D, planarization may remove gate metal overburden and expose isolation dielectric 325 and/or any intervening dielectric materials (e.g., spacer dielectric 325). Gate metal 331 is then recessed below the surrounding dielectric using any known technique. In an advantageous embodiment further illustrated in FIG. 6E, a plasma-based gate electrode recess etch 650 is performed. The recess etch is performed to reduce the z-height of gate metal 331 and achieve a predetermined recess depth $D_{R,1}$ relative to a top surface of spacer dielectric 325. The target recess depth $D_{R,1}$ may be a function of the gate length $L_{HV}$ to achieve a recess with the desired aspect ratio (e.g., $D_{R,1}=L_{HV}$, or a 1:1AR). As illustrated in FIG. 6E, recess etch 650 is substantially uniform across the gate lengths $L_{HV}$ and $L_{LV}$ (i.e., less than 10% variation in z-height).

Returning to FIG. 5C, method 503 proceeds to operation 535 where a mask material is deposited over the substrate, backfilling the recesses between spacer dielectric 325. Any suitable mask material and deposition process known in the art may be utilized at operation 535. In the exemplary embodiment illustrated in FIG. 6F, a carbonaceous mask 660 is deposited. The carbonaceous mask may be any carbon-based material that offers good etch rate control, sufficient etch selectivity to surrounding materials, and can be adequately planarized. In one embodiment, carbonaceous mask 660 is a photo resist applied by any spin-on process, which is self-planarizing. Alternative embodiments include a CVD diamond-like carbon (DLC) mask, which may need subsequent planarization. The planarized mask material 660 is then recessed to a level below the z-height of surrounding spacer dielectric 325. Any etchback process, such as a dry plasma-based etch, known to be suitable for thinning a particular mask material may be utilized (e.g., oxidizing plasma for a photo resist mask). The mask recess etching is to reduce the z-height of mask 660 and achieve a predetermined recess depth $D_{R,2}$ relative to a top surface of spacer dielectric 325. Recess depth $D_{R,2}$ may be a function of the gate length $L_{HV}$ to achieve a recess of desired aspect ratio (e.g., <1:1AR). As further illustrated in FIG. 6F, mask recess etch 651 is substantially uniform across the gate lengths $L_{HV}$ and $L_{LV}$ (i.e., less than 10% variation in z-height).

Figure 6G:
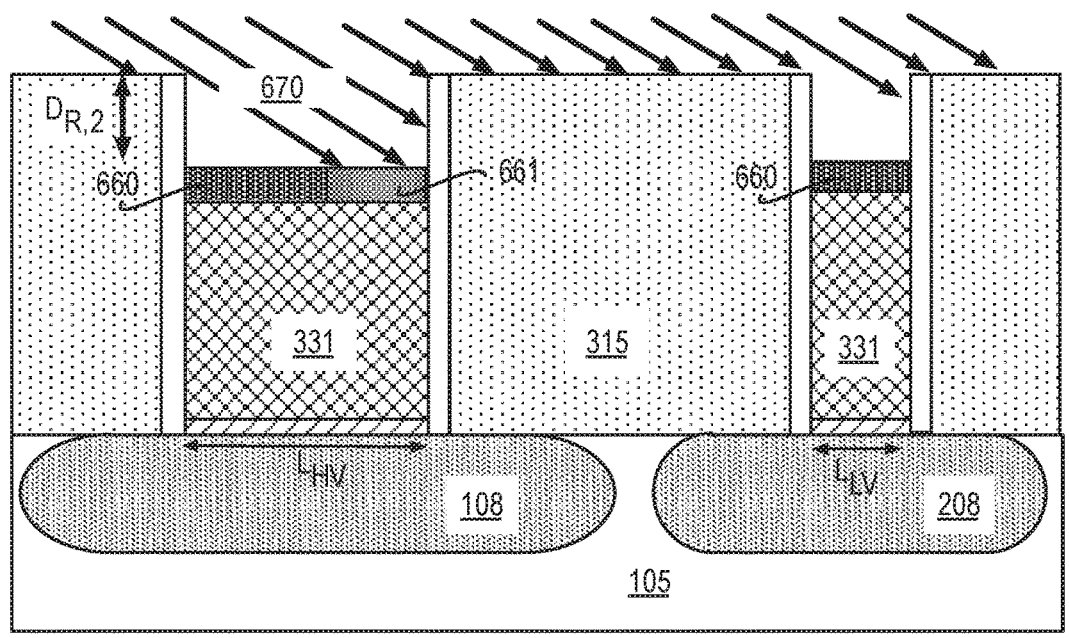
Figure 6H:
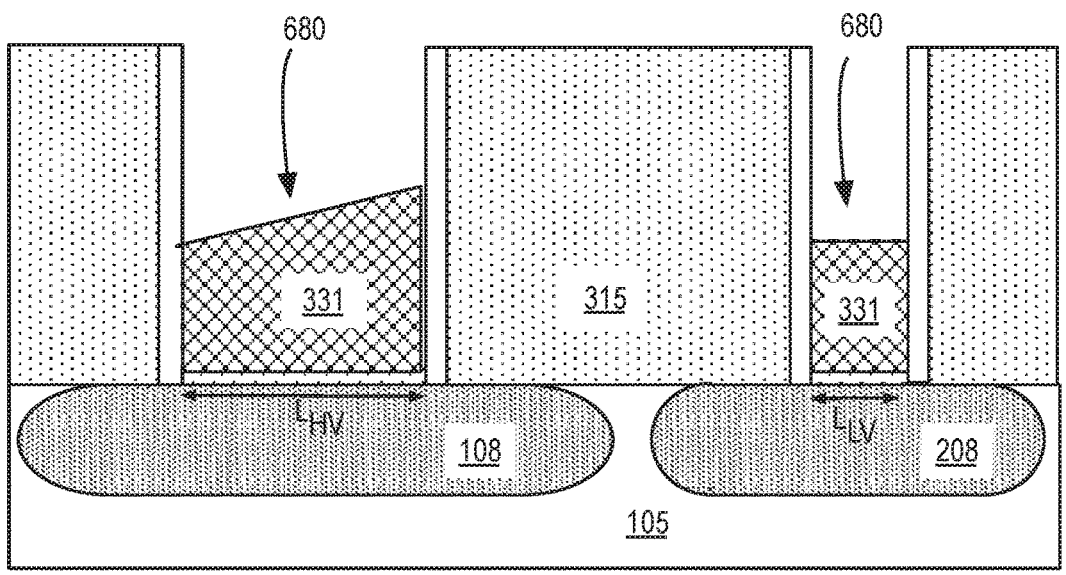

Returning to FIG. 5C, at operation 537 an angled implant is performed to selectively modify etch resistance of a portion of the mask material disposed with in the openings. Advantageously, the angled implant modifies only the mask material visible to the ion flux as a function of the solid angle determined by the aspect ratio of the recesses formed at operation 516 and/or 535. As shown in FIG. 6G, implant 670 forms a modified mask material 661 over a portion of lateral length $L_{HV}$. Any practical implant angle may be utilized with exemplary implant angles being between 45-80°. The implant angle may be chosen in conjunction with the recess depth $D_{R,2}$ to irradiate a mask portion 661 disposed in a larger opening of lateral length $L_{HV}$, while the entirety of mask material 660 disposed in smaller opening of lateral length $L_{LV}$ is shadowed from implant species flux. Depending on the embodiment, the mask material modified through exposure to implanted species may be rendered more or less resistant to a particular etch process than unmodified mask material. In one exemplary embodiment where the mask material is a carbonaceous mask (e.g., photo resist), implantation of Si ions will reduce an etch rate of modified mask material 661 significantly below that of unmodified mask 660 (e.g., in fluorine-based plasma). In an alternative embodiment where the mask material is a carbonaceous mask (e.g., photo resist), implantation of Ar ions will increase an etch rate of modified mask material 661 significantly above that of unmodified mask 660 (e.g., in an fluorine-based plasma).

Returning to FIG. 5C, at operation 539 gate metal is recessed a second time. The metal recess etch at operation 539 is a further function of the etch rate of the mask material disposed over the gate metal, a portion of which was modified by the angled implant operation 537. In a first embodiment, where the modified mask material has enhanced resistance to the gate metal etch process, a portion of the gate metal disposed under the unmodified mask material is recessed by a greater amount than that disposed below the modified mask material. Depending on the abruptness of the implanted species profile, the material properties of the mask material, and the recess etch characteristics, the gate metal recess profile may be gradual/tapered, or an abrupt/step function. In one exemplary embodiment illustrated in FIG. 6H, an isotropic etch process 680 is employed to form a gradual change in thickness of gate metal 331 along the gate electrode length $L_{HV}$. Because the entirety of mask material 660 was unmodified for openings of lateral dimension $L_L$, isotropic etch process 680 uniformly recesses the unmodified mask 660, and subsequently gate metal 331, along the gate electrode length $L_{HV}$ to a thickness approximately equal to the minimum thickness along the gate electrode length $L_{HV}$. In an alternative embodiment, where anisotropic gate metal recess is performed at operation 539, an abrupt step function in thickness of gate metal 331 may be positioned along the gate electrode length $L_{HV}$ through control of the recess AR.

In a second embodiment, where the modified mask material has impaired resistance to the gate metal etch process, a portion of the gate metal disposed under the unmodified mask material is recessed by a lesser amount than that disposed below the modified mask material. For such embodiments, recessing of the mask material to a predetermined depth $D_{R,2}$ (FIG. 6F) is rather less important as the gate metal recess etch of operation 539 is primarily dependent on the initial recess depth $D_{R,1}$ (FIG. 6E) because any mask material exposed to implant has an accelerated etch rate. Hence, the only recessing of mask material need be in conjunction with the recessing of gate metal at operation 539. For the second embodiment, because the entirety of mask material 660 was unmodified for openings of lateral dimension $L_L$, a recess etch process will uniformly recesses the mask and gate metal 331 along the gate electrode length $L_{LV}$ to a thickness approximately equal to the maximum thickness along the gate electrode length $L_{HV}$. Notably, both the first and second exemplary embodiments employing angled implantation of a mask material may provide the monotonic variation in gate metal thickness over a gate electrode of sufficient lateral length, as described above (e.g., in the context of FIG. 3A, FIG. 3B, FIG. 4).

Figure 6I:
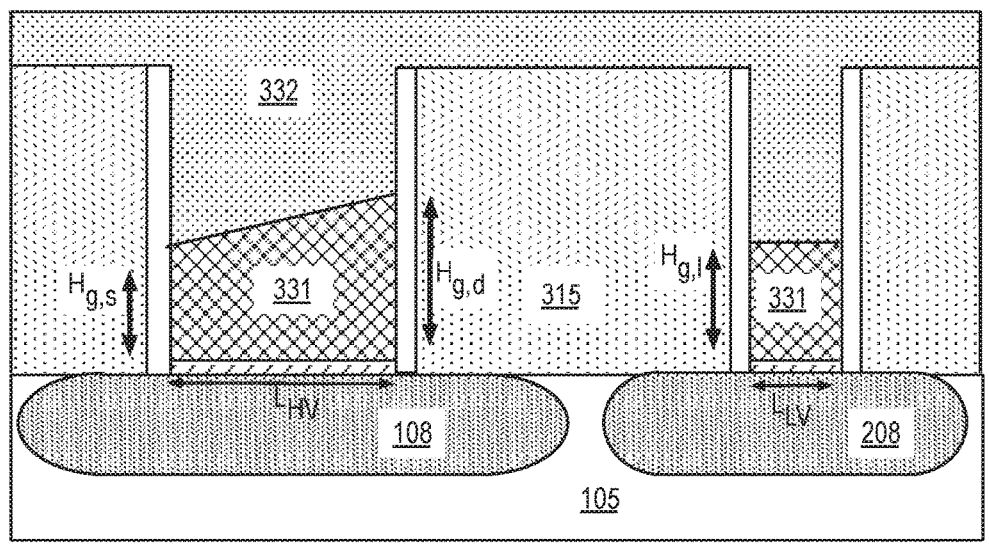
Figure 6J:
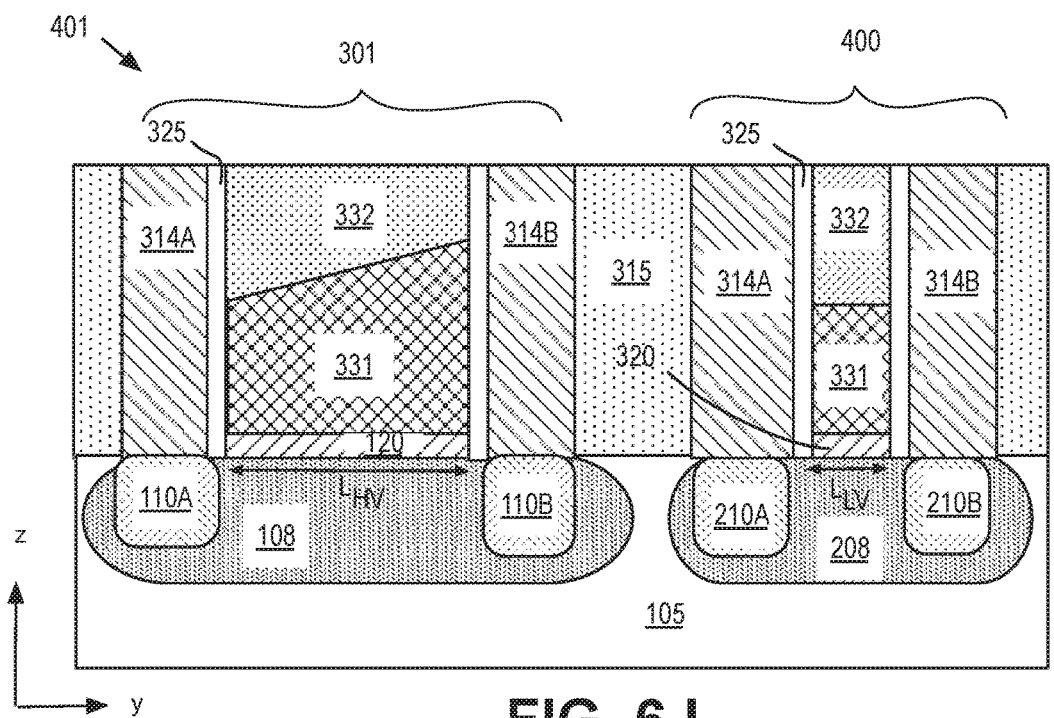

Returning to FIG. 5C, at operation 543 the recesses formed at operation 539 are backfilled with a gate capping material. As described above, the gate capping material may be a metal, semiconductor, or dielectric. As illustrated in FIG. 6I, gate capping material 332 is deposited and planarized with a top surface of spacer dielectric 325 and/or isolation dielectric 315. Planarization is particularly advantageous where gate capping material 332 is to alloy with gate metal 331. Any known deposition technique, such as a self-planarizing spin-on deposition, or a non-planarizing vapor deposition may be utilized to deposit gate capping material 332. Non-planarizing deposition embodiments may further include a subsequent planarization (e.g., CMP) operation. Method 503 then ends at operation 553 where a HV MOS transistor is completed with the wider gate electrode, and a logic MOS transistor is completed with the narrower gate electrode. After formation of source/drain contacts as illustrated in FIG. 6J, the semiconductor device including HV transistor 301 with a laterally graduated gate metal work function, and LV logic transistor 400 with a non-graduated gate metal work function, is then ready for upper level metallization according to convention.

Figure 7:
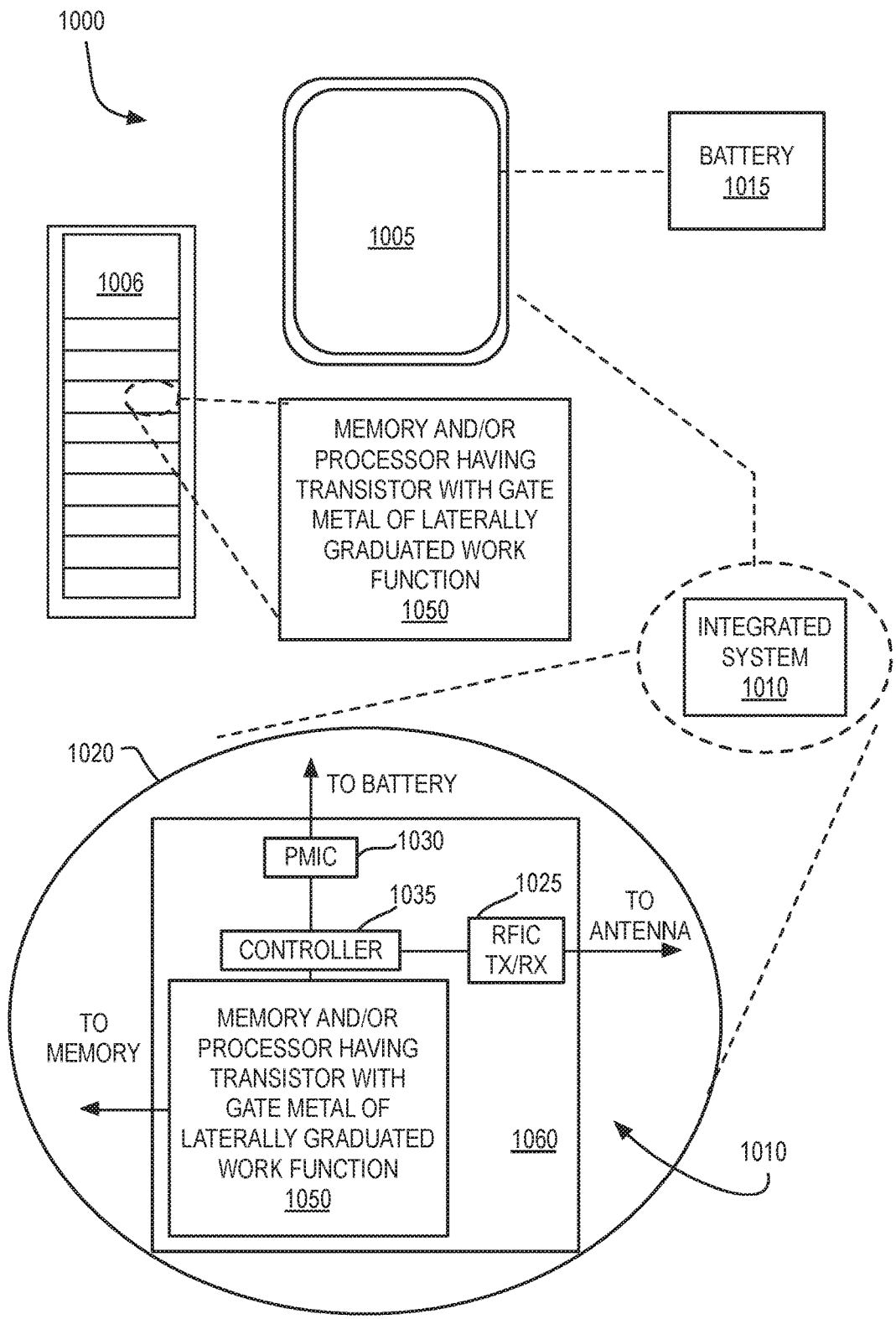
FIG. 7 illustrates a mobile computing platform and a data server machine employing a transistor including a gate metal with a laterally graduated work function, in accordance with embodiments of the present invention.

FIG. 7 illustrates a system 1000 in which a mobile computing platform 1005 and/or a data server machine 1006 employs a semiconductor device including a transistor with a laterally graduated gate metal work function, and transistor with a non-graduated gate metal work function in accordance with embodiments of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing a monolithic architecture including a transistor with a laterally graduated gate metal work function, for example as discussed elsewhere herein. Advantageously, integrated system 1010 includes a semiconductor device further including a transistor with a laterally graduated gate metal work function, and transistor with a non-graduated gate metal work function, for example as discussed elsewhere herein. The monolithic IC 1050 may be further coupled to a board, a substrate, or an interposer 1060 along with, one or more of: a power management integrated circuit (PMIC) 1030; RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path); and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 8:
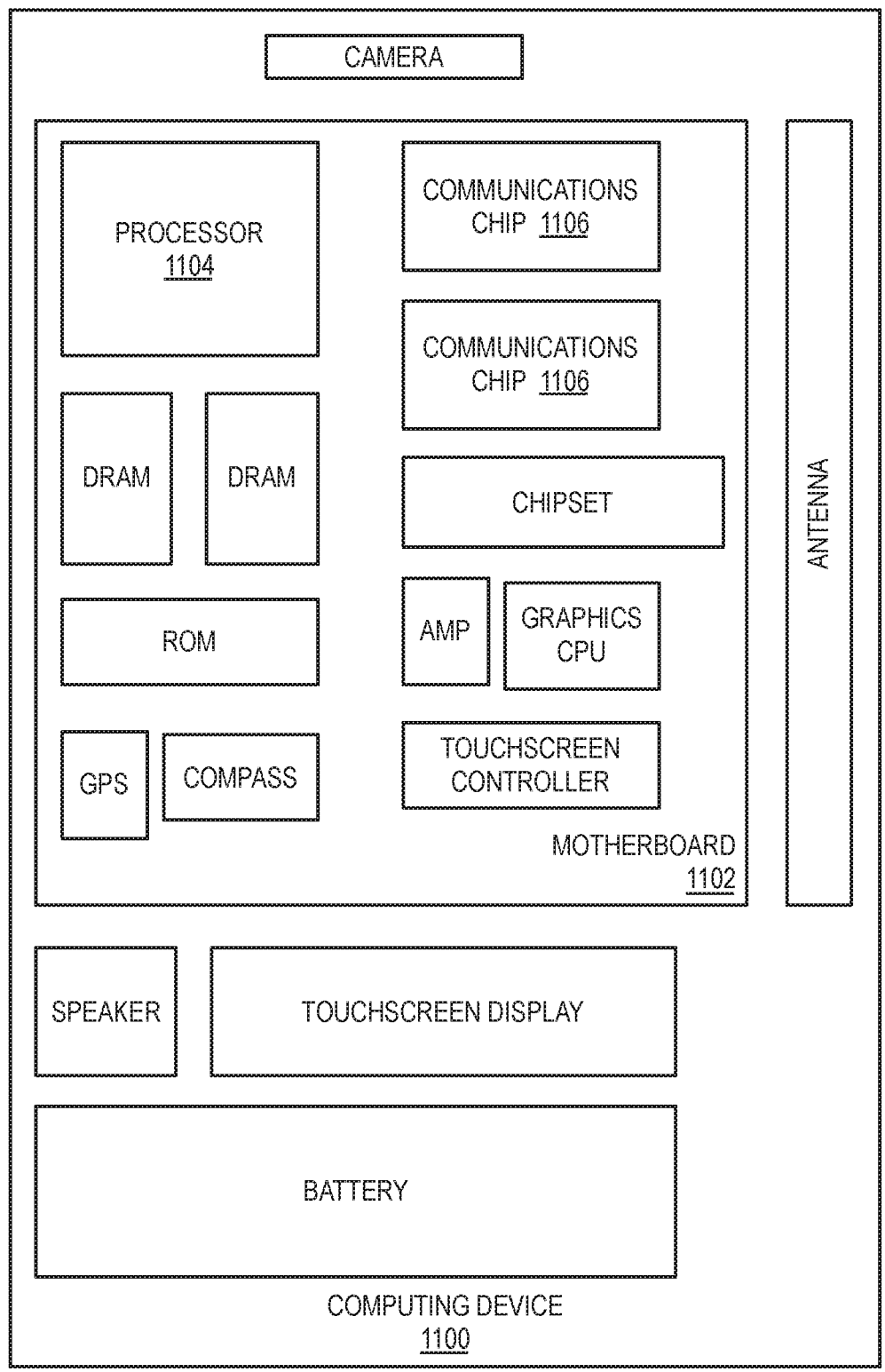
FIG. 8 is a functional block diagram of an electronic computing device, in accordance with an embodiment of the present invention.

FIG. 8 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as but not limited to a processor 1104 (e.g., an applications processor), which may further incorporate a transistor with a laterally graduated gate metal work function, for example as discussed elsewhere herein. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one or more first exemplary embodiment, a semiconductor device includes a first transistor. The first transistor further includes a first semiconductor channel region disposed over a substrate. The first transistor further includes a first semiconductor source region and a first drain region, of a conductivity type complementary to the first channel region, disposed over the substrate and on opposite sides of the first channel region. The first transistor further includes a first source contact interfacing with the first source region and a first drain contact interfacing with the first drain region. The first transistor further includes a first gate dielectric disposed over the first channel region. The first transistor further includes a first gate electrode separated from the first channel region by the first gate dielectric and separated from the first drain and source contacts by first intervening spacer dielectric, the first gate electrode further comprising at least a first gate metal having a work function that varies monotonically over a gate length of the gate electrode between the first source and drain regions.

In furtherance of the first embodiment, the first source and drain regions are n-type and the work function of the first gate metal monotonically decreases from a first work function value proximal to the first source region to a second work function value proximal to the first drain region. Alternatively, the first source and drain regions are p-type and the work function of the first gate metal monotonically increases from a first work function value proximal to the first source region to a second work function value proximal to the first drain region.

In furtherance of the first embodiment, thickness of the first gate metal varies monotonically over the length of the first gate electrode between the first source region and first drain region. Alternatively, alloy composition of the first gate metal varies monotonically over the length of the first gate electrode between the first source region and first drain region.

In furtherance of the embodiment immediately above, thickness of the first gate metal increases from a non-zero first thickness value at a source edge of the first gate electrode to a second thickness value at a drain edge of the first gate electrode.

In furtherance of the embodiment immediately above, the second thickness value is at least 10% greater than the first thickness value, and the first gate metal at the first thickness value is associated with a first threshold voltage ($V_t$) that is at least 100 mV lower than a second $V_t$ associated with the first gate metal at the second thickness value.

In furtherance of the embodiment above, a top surface of the first gate electrode at both the source edge and drain edge is recessed to a z-height below that of a top surface of the first intervening spacer dielectric. The first transistor further includes a gate capping material disposed over the first gate metal between the first intervening spacer dielectric.

In furtherance of the embodiment above, the device further includes a second transistor. The second transistor further includes a second semiconductor channel region disposed over the substrate. The second transistor further includes a second semiconductor source region and a second drain region, of a conductivity type complementary to the second channel region, disposed over the substrate and on opposite sides of the second channel region. The second transistor further includes a second source contact interfacing with the second source region and a second drain contact interfacing with the second drain region. The second transistor further includes a second gate dielectric disposed over the second channel region. The second transistor further includes a second gate electrode separated from the second channel region by the second gate dielectric and separated from the second drain and source contacts by a second intervening spacer dielectric, the second gate electrode further comprising at least the first gate metal, and the first gate metal having a thickness that varies over the length of the second gate electrode between the second source and second drain region by a lesser amount than that in the first gate electrode.

In furtherance of the embodiment immediately above, the thickness of the first gate metal increases from a non-zero first thickness value at a source edge of the first gate electrode to a second thickness value at a drain edge of the first gate electrode that is at least 10% greater than the first thickness value. The second gate metal has a thickness that varies by less than 10% between source and drain edges of the second gate electrode and has a average thickness that is less than the first thickness value.

In furtherance of the embodiment immediately above, the second gate metal has a second gate length that is smaller than the first gate length.

In furtherance of an embodiment above, a top surface of the first gate metal at the source edge is recessed to a z-height below that of a top surface of the first intervening spacer dielectric. A top surface of the second gate metal at both a drain edge and a source edge is recessed to a z-height below that of a top surface of the second intervening spacer dielectric. A gate capping material is disposed over the first gate metal and between the first intervening spacer dielectric. The gate capping material is disposed over the second gate metal and between the second intervening spacer dielectric.

In furtherance of the embodiment immediately above, the first thickness value is less than 100 nm. The second thickness value is at least 20% greater than the first thickness value. The first gate electrode has a gate length of at least 10 nm and the second gate electrode has a gate length smaller than that of the first gate electrode. The first and second gate metals have the same composition. The gate capping material is a dielectric. The gate capping material interfaces with the first and second gate metals.

In one or more second exemplary embodiment, a method of fabricating a semiconductor device includes forming a first gate electrode opening in a surrounding dielectric material, the first opening exposing a first semiconductor channel region. The method further includes forming a first gate dielectric over the first semiconductor channel region. The method further includes depositing a first gate metal in the first opening. The method further includes graduating the first gate metal thickness between a source end and drain end by recessing the first gate metal relative to the surrounding dielectric material non-uniformly within the first opening. The method further includes forming first source and drain contacts to first source and drain regions disposed on opposite sides of the first channel region.

In furtherance of the second embodiment, graduating the first gate metal thickness between a source end and drain end comprises recessing the first gate metal by a greater amount at a source edge of the first gate electrode than at drain edge of the first gate electrode.

In furtherance of the embodiment immediately above, graduating the first gate metal thickness further includes planarizing the first gate metal with the surrounding dielectric material. Graduating the first gate metal thickness further includes recessing the first gate metal below the surrounding dielectric material. Graduating the first gate metal thickness further includes directionally depositing or modifying a mask material over the recessed first gate metal, the depositing or modifying being non-uniform along a length of the mask material within the first opening as a function of an aspect ratio of the first opening.

In furtherance of an embodiment above, modifying the property of the mask material further comprises exposing a portion of the mask material within the opening to an angled implant that modifies the etch rate of the exposed mask material. Depositing the second material further comprises depositing a dielectric material.

In furtherance of the second embodiment, fabricating the device further includes forming a second opening in a surrounding dielectric material, the second opening exposing a second semiconductor channel region. Fabricating the device further includes forming a second gate dielectric over the second semiconductor channel region. Fabricating the device further includes forming a second gate electrode by backfilling the second opening with the first gate metal. Fabricating the device further includes recessing the first gate metal within the second opening without graduating the first gate metal thickness between a source end and drain end of the second gate electrode. Fabricating the device further includes forming second source and drain contacts to second source and drain regions disposed on opposite sides of the second channel region.

In furtherance of the embodiment immediately above, the first opening has a lateral dimension larger than that of the second opening. Graduating the first gate metal thickness within the first opening and recessing first gate metal without graduating the first gate metal thickness within the second opening further includes planarizing the first gate metal with the surrounding dielectric material, recessing the first gate metal within the first and second openings below the surrounding dielectric material, depositing a mask material over the recessed gate metal, performing an angled implant that modifies the etch rate of an exposed portion of the mask material within the first opening, and recessing the first gate metal a second amount that varies more over a length of the first gate electrode that over a length of the second gate electrode as a function of the differing mask material etch rate. The method further includes depositing a gate capping material over the recessed first gate metals. The method further includes planarizing the gate capping material with the surrounding dielectric material.

In one or more third exemplary embodiment, a system on a chip (SoC) includes processor logic circuitry, memory circuitry coupled to the processor logic circuitry, RF circuitry coupled to the processor logic circuitry and including radio transmission circuitry and radio receiver circuitry, and power management circuitry including an input to receive a DC power supply and an output coupled to at least one of the processor logic circuitry, memory circuitry, or RF circuitry. At least one of the RF circuitry or power management circuitry includes the semiconductor device in any one of the first embodiments.

In furtherance of the third embodiment, the semiconductor device further comprises a first transistor. The first transistor includes a first semiconductor channel region disposed over a substrate. The first transistor includes a first semiconductor source region and a first drain region, of a conductivity type complementary to the first channel region, disposed over the substrate and on opposite sides of the first channel region. The first transistor includes a first source contact interfacing with the first source region and a first drain contact interfacing with the first drain region. The first transistor includes a first gate dielectric disposed over the first channel region. The first transistor includes a first gate electrode separated from the first channel region by the first gate dielectric and separated from the first drain and source contacts by a first intervening spacer dielectric, the first gate electrode further comprising at least a first gate metal having a work function that varies monotonically over a gate length of the gate electrode between the first source and drain regions.

In furtherance of the embodiment immediately above, the thickness of the first gate metal increases from a non-zero first thickness value at a source edge of the first gate electrode to a second thickness value at a drain edge of the first gate electrode.

However, the above embodiments are not limited in this regard and, in various implementations, the above embodiments may include undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A device, comprising:
    a transistor including:
        a channel region comprising a semiconductor;
        a source region and a drain region on opposite sides of the channel region;
        a source contact coupled with the source region and a drain contact coupled with the drain region;
        a gate dielectric over the channel region; and
        a gate electrode separated from the channel region by the gate dielectric and separated from the drain and source contacts by an intervening spacer dielectric, the gate electrode including a gate metal having a work function that varies monotonically over a gate length of the gate electrode between the source and drain regions, wherein:
            a thickness of the gate metal increases over the gate length from a non-zero first thickness at a source edge of the gate electrode to a second thickness at a drain edge of the gate electrode;
            a top surface of the gate electrode at the source edge has a z-height below that of a top surface of the spacer dielectric; and
            a top surface of the gate electrode at the drain edge has a z-height below that of a top surface of the spacer dielectric; and
            a gate capping material over the gate metal, the gate capping material separated from the drain and source contacts by the spacer dielectric.

2. The device of claim 1, wherein:
    the source and drain regions are n-type and the work function of the gate metal monotonically decreases from a first work function value proximal to the source region to a second work function value proximal to the drain region; or
    the source and drain regions are p-type and the work function of the gate metal monotonically increases from a first work function value proximal to the source region to a second work function value proximal to the drain region.

3. The device of claim 1, wherein:
    the second thickness is at least 10% greater than the first thickness;
    the gate metal at the first thickness is associated with a first threshold voltage ($V_t$) that is at least 100 mV lower than a second $V_t$ associated with the gate metal at the second thickness.

4. A device, comprising:
    a transistor including:
        a channel region comprising a semiconductor;
        a source region and a drain region on opposite sides of the channel region;
        a source contact coupled with the source region and a drain contact coupled with the drain region;
        a gate dielectric over the channel region; and
        a gate electrode separated from the channel region by the gate dielectric and separated from the drain and source contacts by an intervening spacer dielectric, the gate electrode including a gate metal having a thickness that increases from a non-zero first thickness at a source edge of the gate electrode to a second thickness at a drain edge of the gate electrode;
    a second transistor including:
        a second channel region comprising a semiconductor;
        a second source region and a second drain region on opposite sides of the second channel region;
        a second source contact coupled with the second source region and a second drain contact coupled with the second drain region;
        a second gate dielectric over the second channel region; and
        a second gate electrode separated from the second channel region by the second gate dielectric and separated from the second drain and source contacts by a second intervening spacer dielectric, the second gate electrode further comprising at least the gate metal, and wherein the gate metal has a thickness that varies over a gate length of the second gate electrode by a lesser amount than does the gate metal in the first gate electrode, and wherein the gate metal of the second gate electrode has an average thickness that is less than the first thickness.

5. The device of claim 4, wherein:
    the second thickness at the drain edge of the gate electrode is at least 10% greater than the first thickness;
    the gate metal has a thickness that varies by less than 10% between the source and drain edges of the second gate electrode.

6. The device of claim 4, wherein:
    the gate length of the second gate electrode is smaller than the gate length of the first gate electrode.

7. The device of claim 6, wherein:
    a top surface of the gate metal at the source edge of the first gate electrode has a z-height below a top surface of the intervening spacer dielectric;
    a top surface of the gate metal at both a drain edge and a source edge of the second gate electrode has a z-height below a top surface of the second intervening spacer dielectric;
    a gate capping material is over the gate metal and is separated from the drain and source contacts by the intervening spacer dielectric; and
    the gate capping material is over the gate metal and is separated from the second drain and second source contacts by the second intervening spacer dielectric.

8. The device of claim 7, wherein:
    the first thickness is less than 100 nm;
    the second thickness is at least 20% greater than the first thickness;
    the gate electrode has a gate length of at least 10 nm;
    the gate metal of the first and second gate electrodes have the same composition;
    the gate capping material is a dielectric; and
    the gate capping material interfaces with the gate metal.

9. A system on a chip (SoC), comprising:
    processor logic circuitry;
    memory circuitry coupled to the processor logic circuitry;
    RF circuitry coupled to the processor logic circuitry and including radio transmission circuitry and radio receiver circuitry; and
    power management circuitry including an input to receive a DC power supply and an output coupled to at least one of the processor logic circuitry, memory circuitry, or RF circuitry, wherein at least one of the RF circuitry or power management circuitry includes a transistor further comprising:

a semiconductor channel region;
a source region and a first drain region on opposite sides of the first channel region;
a source contact interfacing with the source region and a drain contact interfacing with the drain region;
a gate dielectric disposed over the channel region; and
a gate electrode separated from the channel region by the gate dielectric and separated from the drain and source contacts by an intervening spacer dielectric, the gate electrode further comprising a gate metal having a work function that varies monotonically over a gate length of the gate electrode between the source and drain regions.

10. The SoC of claim 9, wherein the thickness of the gate metal increases from a non-zero first thickness at a source edge of the gate electrode to a second thickness at a drain edge of the gate electrode.

11. A device, comprising:
a transistor including:
   a channel region comprising a semiconductor;
   a source region and a drain region on opposite sides of the channel region;
   a source contact coupled with the source region and a drain contact coupled with the drain region;
   a gate dielectric over the channel region; and
   a gate electrode separated from the channel region by the gate dielectric and separated from the drain and source contacts by an intervening spacer dielectric, the gate electrode including a gate metal having a work function that varies monotonically over a gate length of the gate electrode between the source and drain regions, wherein:
      a thickness of the gate metal increases from a non-zero first thickness at a source edge of the gate electrode to a second thickness at a drain edge of the gate electrode;
      the second thickness is at least 10% greater than the first thickness; and
      the gate metal at the first thickness is associated with a first threshold voltage ($V_t$) that is at least 100 mV lower than a second $V_t$ associated with the gate metal at the second thickness.

* * * * *